United States Patent
Masuda et al.

(10) Patent No.: US 9,350,527 B1
(45) Date of Patent: May 24, 2016

(54) RECEPTION UNIT AND RECEIVING METHOD

(71) Applicant: Sony Corporation, Tokyo (JP)

(72) Inventors: Takashi Masuda, Tokyo (JP); Yosuke Ueno, Kanagawa (JP); Zhiwei Zhou, Tokyo (JP); Kenichi Maruko, Kanagawa (JP); Jeremy Chatwin, Scotts Valley, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/666,528

(22) Filed: Mar. 24, 2015

(51) Int. Cl.
*H04L 7/00* (2006.01)

(52) U.S. Cl.
CPC ............ *H04L 7/0033* (2013.01); *H04L 7/0087* (2013.01)

(58) Field of Classification Search
CPC ......... H04L 7/0331; H04L 7/033; H04L 7/04; H04L 25/0262; H04L 7/0033; H04L 7/0087; H03L 7/0814; H03L 7/00; H03L 7/081
USPC ......... 375/355, 359–360, 371, 373, 375–376; 370/503, 516–517
See application file for complete search history.

(56) References Cited

U.S. PATENT DOCUMENTS

| | | | | |
|---|---|---|---|---|
| 5,574,756 A | * | 11/1996 | Jeong | H03L 7/0812 327/147 |
| 7,912,167 B2 | * | 3/2011 | Saeki | H03L 7/0814 375/326 |
| 2003/0091137 A1 | * | 5/2003 | Vallet | H04L 7/0338 375/360 |
| 2003/0214335 A1 | * | 11/2003 | Saeki | H03K 5/133 327/165 |
| 2005/0105662 A1 | * | 5/2005 | Margules | H03L 7/06 375/376 |
| 2006/0159211 A1 | * | 7/2006 | Lin | H04L 7/0337 375/355 |
| 2007/0081619 A1 | * | 4/2007 | Kuo | H03L 7/0805 375/371 |
| 2010/0246660 A1 | * | 9/2010 | Matsuo | H03L 7/0807 375/239 |
| 2011/0261408 A1 | * | 10/2011 | Nishio | H04N 1/00222 358/1.15 |

FOREIGN PATENT DOCUMENTS

| | | |
|---|---|---|
| JP | 08-213979 | 8/1996 |
| JP | 2007-181000 | 7/2007 |

* cited by examiner

*Primary Examiner* — Khanh C Tran
(74) *Attorney, Agent, or Firm* — Michael Best & Friedrich LLP

(57) ABSTRACT

There is provided a reception unit, including: a transition detection section configured to detect a transition of an input data signal; an oscillation section configured to generate a clock signal and vary a phase of the clock signal based on a result of detection made by the transition detection section, the clock signal having a frequency in accordance with a first control signal; a first sampling section configured to sample the input data signal based on the clock signal and thereby generate an output data signal; and a control section configured to generate the first control signal based on the input data signal, the output data signal, and the clock signal.

24 Claims, 30 Drawing Sheets

RECEPTION UNIT AND RECEIVING METHOD

BACKGROUND

The present disclosure relates to a reception unit that receives a data signal, and to a receiving method used in such a reception unit.

In many communication systems, a transmission unit transmits a data signal, and a clock and data recovery (CDR) circuit in a reception unit reproduces a clock signal and the data signal from the received data signal. More specifically, the CDR circuit reproduces the clock signal from the received data signal, and performs retiming on the received data signal with use of the reproduced clock signal to reproduce the data signal. Japanese Unexamined Patent Application Publication Nos. H8-213979, 2007-181000, and 2009-239510 disclose a CDR circuit using a so-called gated voltage controlled oscillator (VCO) that reproduces a clock signal and a data signal based on a burst signal.

SUMMARY

In general, for a communication system, high communication quality is desired, and further improvement of the communication quality is expected.

It is desirable to provide a reception unit and a receiving method that are capable of improving the communication quality.

According to an embodiment of the present disclosure, there is provided a reception unit including a transition detection section, an oscillation section, a first sampling section, and a control section. The transition detection section is configured to detect a transition of an input data signal. The oscillation section is configured to generate a clock signal and vary a phase of the clock signal based on a result of detection made by the transition detection section. The clock signal has a frequency in accordance with a first control signal. The first sampling section is configured to sample the input data signal based on the clock signal and thereby generate an output data signal. The control section is configured to generate the first control signal based on the input data signal, the output data signal, and the clock signal.

According to an embodiment of the present disclosure, there is provided a receiving method including: detecting a transition of an input data signal; generating a clock signal and varying a phase of the clock signal based on the transition of the input data signal, the clock signal having a frequency in accordance with a first control signal; sampling the input data signal based on the clock signal, and thereby generating an output data signal; and generating the first control signal based on the input data signal, the output data signal, and the clock signal.

In the reception unit and the receiving method of the embodiments of the present disclosure, the phase of the clock signal is varied based on the transition of the input data signal, the input data signal is sampled based on the clock signal, and the output data signal is thereby generated. The frequency of the clock signal is controlled, with use of the first control signal, based on the input data signal, the output data signal, and the clock signal.

According to the reception unit and the receiving method of the embodiments of the present disclosure, the first control signal is generated based on the input data signal, the output data signal, and the clock signal. As a result, it is possible to improve the communication quality. It is to be noted that effects of the present disclosure are not necessarily limited to the effects described above, and may include any of effects described herein.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
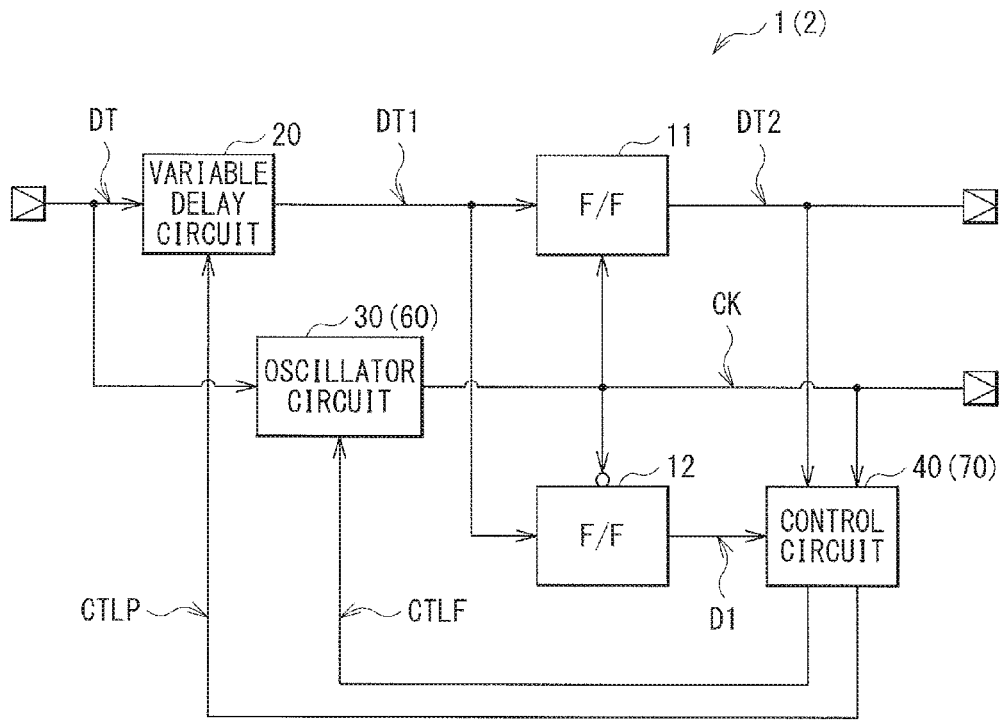
FIG. 1 is a block diagram illustrating a configuration example of a reception unit according to an embodiment of the present disclosure.

Some embodiments of the present disclosure are described below in detail with reference to the drawings. The description is provided in the following order.
1. First Embodiment
2. Second Embodiment 1. First Embodiment Configuration Example FIG. 1 illustrates a configuration example of a reception unit (a reception unit 1) according to a first embodiment of the present disclosure. It is to be noted that a receiving method according to an embodiment of the present disclosure is embodied by the present embodiment, and is therefore described together.

The reception unit 1 may be a CDR circuit that reproduces a clock signal CK and a data signal DT2 from a received data signal DT. For example, the data signal DT may be scrambled, and may include a signal portion that toggles consecutively as "1010". The reception unit 1 may include a variable delay circuit 20, an oscillator circuit 30, flip-flop circuits 11 and 12, and a control circuit 40.

The variable delay circuit 20 delays the data signal DT by a delay amount in accordance with a control signal CTLP, and outputs the delayed signal as a data signal DT1.

Figure 2:
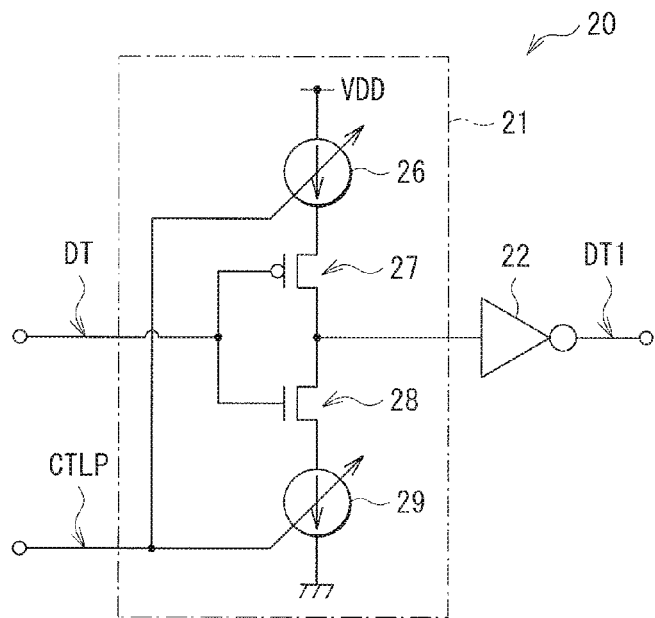
FIG. 2 is a circuit diagram illustrating a configuration example of a variable delay circuit illustrated in FIG. 1.

FIG. 2 illustrates a configuration example of the variable delay circuit 20. The variable delay circuit 20 includes a delay circuit 21 and an inverter 22. It is to be noted that, although one delay circuit 21 is used to configure the variable delay circuit 20 in this example, the number of the delay circuit 21 is not limited to one, and a plurality of delay circuits 21 that are connected in series to one another may be used to configure the variable delay circuit 20.

The delay circuit 21 delays the data signal DT by a delay amount in accordance with the control signal CTLP and inverts the data signal, as well as outputs the delayed and inverted signal. The delay circuit 21 includes current sources 26 and 29 and transistors 27 and 28. Each of the current sources 26 and 29 is a so-called variable current source that generates a current, having a current value in accordance with the control signal CTLP, from a first terminal thereof to a second terminal thereof. The first terminal of the current source 26 is supplied with a power voltage VDD, and the second terminal thereof is connected to a source of the transistor 27. The first terminal of the current source 29 is connected to a source of the transistor 28, and the second terminal thereof is grounded. The transistor 27 is a P-channel metal oxide semiconductor (MOS) transistor. A gate of the transistor 27 is supplied with the data signal DT, the source thereof is connected to the second terminal of the current source 26, and a drain thereof is connected to a drain of the transistor 28 and is connected to an input terminal of the inverter 22. The transistor 28 is an N-channel MOS transistor. A gate of the transistor 28 is supplied with the data signal DT, the drain thereof is connected to the drain of the transistor 27 and is connected to the input terminal of the inverter 22, and the source thereof is connected to the first terminal of the current source 29.

In the delay circuit 21, this configuration allows the transistors 27 and 28 to function as inverters to invert the data signal DT and output the inverted signal. At that time, the current sources 26 and 29 each generate the current having the current value in accordance with the control signal CTLP. Accordingly, in the delay circuit 21, when the current value is large, an output voltage makes a transition in a short time, which results in a small delay amount, and when the current value is small, the output voltage makes a transition slowly, which results in a large delay amount. The delay circuit 21 thus functions as a current-control-type delay circuit. It is to be noted that, although the delay amount is controlled based on the current value in this example, the configuration to be employed is not limited thereto. Alternatively, various configurations that are capable of adjusting the delay amount may be employed. For example, a method of controlling the delay amount based on a load capacitance value may be employed.

The inverter 22 inverts a signal supplied from the delay circuit 21, and outputs the inverted signal as the data signal DT1.

Figure 3:
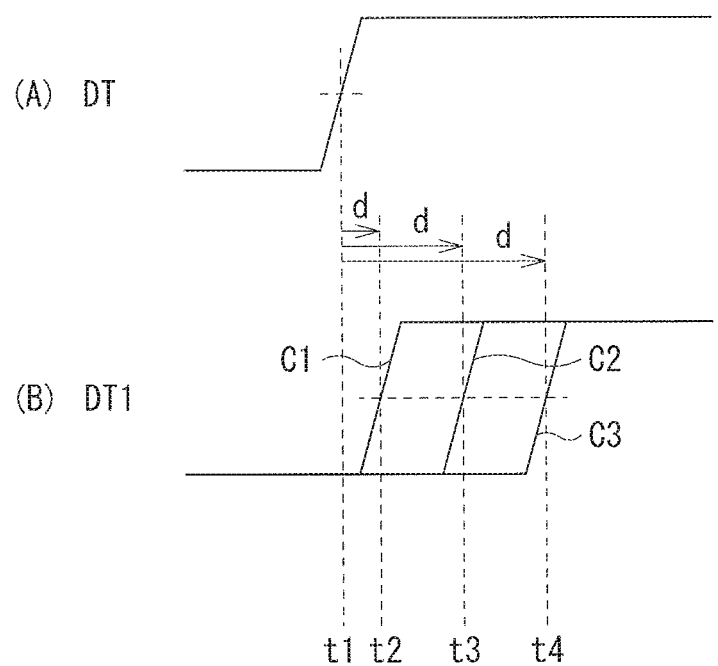
FIG. 3 is a timing waveform chart illustrating an operation example of the variable delay circuit illustrated in FIG. 1.

FIG. 3 illustrates an operation example of the variable delay circuit 20, in which (A) illustrates a waveform of the data signal DT, and (B) illustrates a waveform of the data signal DT1. (B) of FIG. 3 illustrates the data signals DT1 in three cases C1 to C3. The case C1 is a case where a delay amount "d" is small, the case C2 is a case where the delay amount "d" is medium, and the case C3 is a case where the delay amount "d" is large. In the variable delay circuit 20, both of the delay circuit 21 and the inverter 22 invert the signals inputted thereto and output the inverted signals. Accordingly, a polarity of the signal (the data signal DT) inputted to the variable delay circuit 20 is the same as a polarity of a signal (the data signal DT1) outputted from the variable delay circuit 20. The delay amount "d" of the variable delay circuit 20 corresponds to sum of the delay amount of the delay circuit 21 and the delay amount of the inverter 22. The delay amount "d" is so controlled by the control circuit 40 with use of the control signal CTLP that a falling timing of the clock signal CK (described later) coincides with a transition timing of the data signal DT1, which is described later.

The oscillator circuit 30 generates the clock signal CK that has a frequency in accordance with the control signal CTLF. The oscillator circuit 30 also has a function of varying a phase of the clock signal CK based on the data signal DT.

Figure 4:
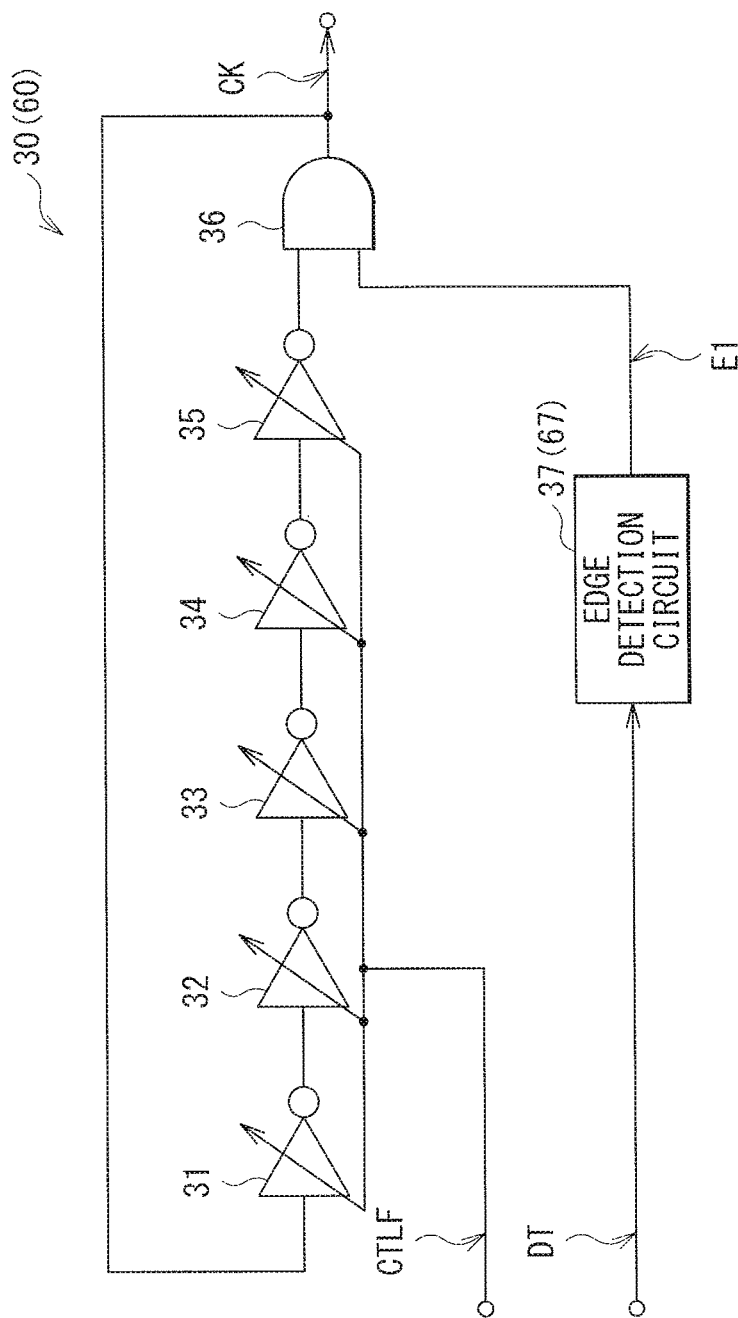
FIG. 4 is a circuit diagram illustrating a configuration example of an oscillator circuit illustrated in FIG. 1.

FIG. 4 illustrates a configuration example of the oscillator circuit 30. The oscillator circuit 30 includes an edge detection circuit 37, delay circuits 31 to 35, and an AND circuit 36. It is to be noted that, although five delay circuits 31 to 35 are used in this example, the number of the delay circuits is not limited to five. Alternatively, four-or-less delay circuits may be used, or six or more delay circuits may be used.

The edge detection circuit 37 detects a rising edge and a falling edge of the data signal DT, and thereby generates a signal E1. More specifically, the edge detection circuit 37 sets the signal E1 to a high level when the data signal DT makes no transition, and sets the signal E1 to a low level in a period PG when the data signal DT makes a transition. The period PG is a period having a length that is about half of a bit length (a unit interval UI) of the data signal DT.

Each of the delay circuits 31 to 35 delays a signal inputted thereto by a delay amount in accordance with the control signal CTLF and inverts the signal, as well as outputs the delayed and inverted signal. Each of the delay circuits 31 to 35 may have a configuration similar to the configuration of the delay circuit 21 illustrated in FIG. 2, for example. The delay circuits 31 to 35 are connected in series to one another in this order. An input terminal of the most-upstream delay circuit 31 is connected to an output terminal of the AND circuit 36, and an output terminal of the most-downstream delay circuit 35 is connected to a first input terminal of the AND circuit 36.

The AND circuit 36 calculates a logical product (AND) of a signal supplied to the first input terminal thereof and a signal supplied to the second input terminal thereof, and outputs a result of the calculation as the clock signal CK. The first input terminal of the AND circuit 36 is connected to the output terminal of the delay circuit 35, the second input terminal thereof is connected to an output terminal of the edge detection circuit 37 and is supplied with the signal E1, and the output terminal thereof is connected to the input terminal of the delay circuit 31. It is to be noted that, in addition to the function of calculating AND, the AND circuit 36 may further have a function of setting a delay amount in accordance with the control signal CTLF as with the delay circuits 31 to 35.

Due to this configuration, in the oscillator circuit 30, when the data signal DT makes no transition, the signal E1 is kept at the high level. Accordingly, a loop including the delay circuits 31 to 35 and the AND circuit 36 configures a so-called ring oscillator, and generates the clock signal CK having the frequency in accordance with the control signal CTLF. More specifically, for example, when the respective delay amounts of the delay circuits 31 to 35 are large, a delay amount of the loop is made large, which causes the frequency of the clock signal CK to be low. For example, when the respective delay amounts of the delay circuits 31 to 35 are small, the delay amount of the loop is made small, which causes the frequency of the clock signal CK to be high. As will be described later, the frequency of the clock signal CK is so controlled by the control circuit 40 with use of the control signal CTLF that a value of a bit rate of the data signal DT become the same as a value of the frequency of the clock signal CK.

In the oscillator circuit 30, when the data signal DT makes a transition, the phase of the clock signal CK is varied in response to the transition of the data signal DT. Specifically, when the data signal DT makes a transition, the signal E1 is set to the low level for a predetermined period in response to the transition of the data signal DT. The AND circuit 36 therefore sets the output signal (the clock signal CK) to the low level. In other words, the oscillator circuit 30 corrects the phase of the clock signal CK in response to the transition of the data signal DT. After this transition, the loop in the oscillator circuit 30 functions as the ring oscillator. In such a manner, the oscillator circuit 30 varies the phase of the clock signal CK based on the data signal DT.

Figure 5:
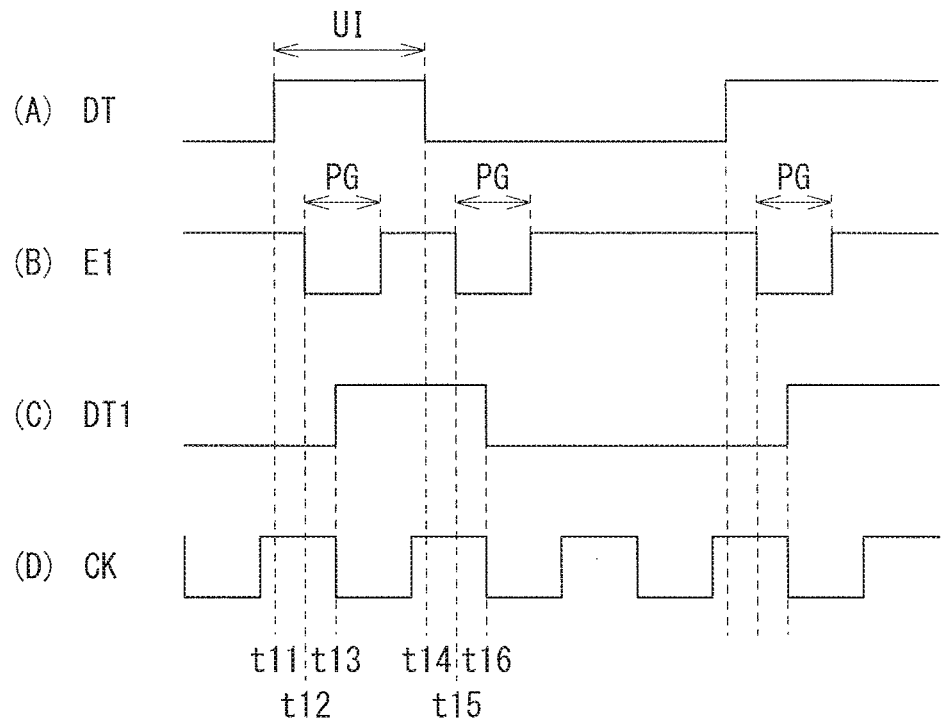
FIG. 5 is a timing waveform chart illustrating an operation example of a variable delay circuit and an oscillator circuit according to a first embodiment.

FIG. 5 illustrates an operation example of the variable delay circuit 20 and the oscillator circuit 30, in which (A) illustrates the waveform of the data signal DT, (B) illustrates a waveform of the signal E1, (C) illustrates the waveform of the data signal DT1, and (D) illustrates a waveform of the clock signal CK.

In this example, first, the edge detection circuit 37 in the oscillator circuit 30 detects a rising edge of the data signal DT at a timing t11, and sets the signal E1 to the low level in a period PG that starts from a timing t12 ((B) of FIG. 5). The timing t12 is a timing that is later than the timing t11 by a circuit delay. In response to varying of the signal E1 to the low level at the timing t12, the AND circuit 36 sets the clock signal CK to the low level in a predetermined period that starts from a timing t13. The timing t13 is a timing that is later than the timing t12 by a circuit delay. In a similar manner, for example, the edge detection circuit 37 detects a falling edge of the data signal DT at a timing t14, and sets the signal E1 to the low level in a period PG starting from a timing t15 that is a timing that is later than the timing t14 by a circuit delay. In response to varying of the signal E1 to the low level at the timing t15, the AND circuit 36 sets the clock signal CK to the low level in a predetermined period starting from a timing t16 that is a timing that is later than the timing t15 by a circuit delay.

The variable delay circuit 20 delays the data signal DT that rises at the timing t11 and falls at the timing t14 to generate the data signal DT1 that rises at the timing t13 and falls at the timing t16. As a result, a timing at which the clock signal CK falls almost coincides with a timing at which the data signal DT1 makes a transition in the reception unit 1, as illustrated in FIG. 5. In such a manner, the delay amount of the variable delay circuit 20 is so controlled that the falling timing of the clock signal CK coincides with the transition timing of the data signal DT1 in the reception unit 1.

In this example, the flip-flop circuit (F/F) 11 samples the data signal DT1 at the rising timing of the clock signal CK, and thereby generates the data signal DT2. As illustrated in (C) and (D) of FIG. 5, the rising timing of the clock signal CK is near the middle of the unit interval UI of the data signal DT1. In other words, the flip-flop circuit 11 functions as a so-called decision circuit. Further, the flip-flop circuit 11 supplies the generated data signal DT2 to the control circuit 40, and supplies the generated data signal DT2 to a circuit downstream of the reception unit 1 via the output terminal of the flip-flop circuit 11.

In this example, the flip-flop circuit (F/F) 12 samples the data signal DT1 at the falling timing of the clock signal CK, and thereby generates the signal D1. Further, the flip-flop circuit 12 supplies the generated signal D1 to the control circuit 40.

It is to be noted that, although the flip-flop circuit 11 samples the data signal DT1 at the rising timing of the clock signal CK and the flip-flop circuit 12 samples the data signal DT1 at the falling timing of the clock signal CK in this example, the configuration to be employed is not limited thereto. Alternatively, the flip-flop circuit 11 may sample the data signal DT1 at the falling timing of the clock signal CK and the flip-flop circuit 12 may sample the data signal DT1 at the rising timing of the clock signal CK.

Figure 6:
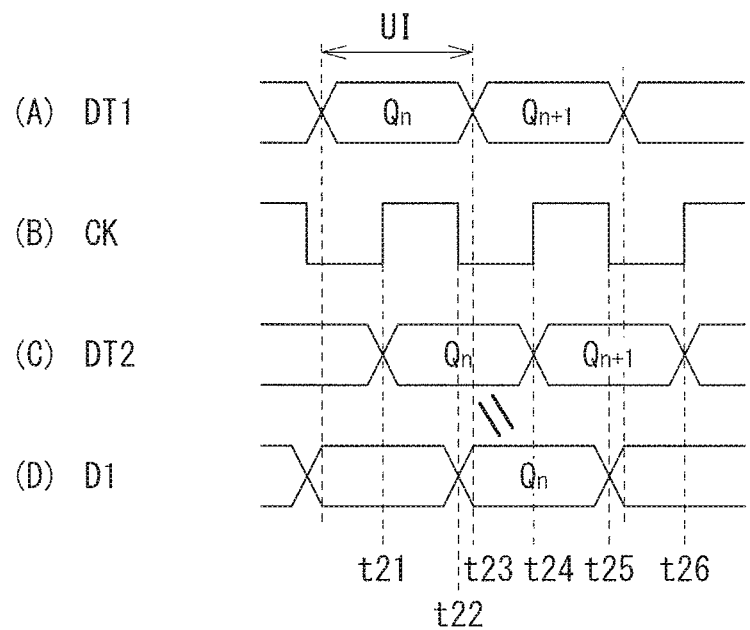
FIG. 6 is a timing waveform chart illustrating an operation example of flip-flop circuits illustrated in FIG. 1.
Figure 7:
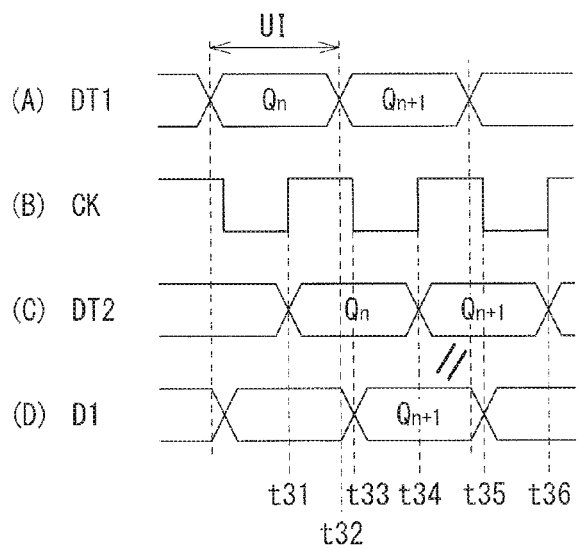
FIG. 7 is a timing waveform chart illustrating another operation example of the flip-flop circuits illustrated in FIG. 1.

FIGS. 6 and 7 each illustrate operations of the flip-flop circuits 11 and 12. FIG. 6 illustrates a case where the phase of the clock signal CK is advanced, and FIG. 7 illustrates a case where the phase of the clock signal CK is delayed. In each of FIGS. 6 and 7, (A) illustrates the waveform of the data signal DT1, (B) illustrates the waveform of the clock signal CK, (C) illustrates a waveform of the data signal DT2, and (D) illustrates a waveform of the signal D1.

In this example, the reception unit 1 is supplied with the data signal DT1 that includes data $Q_n$ and data $Q_{n+1}$. The flip-flop circuit 11 samples the data signal DT1 at a timing when the clock signal CK rises, and thereby generates the data signal DT2. As a result, the data $Q_n$ and the data $Q_{n+1}$ appear in the data signal DT2 as illustrated in FIGS. 6 and 7. The flip-flop circuit 12 samples the data signal DT1 at a timing when the clock signal CK falls, and thereby generates the signal D1.

In the case where the phase of the clock signal CK is advanced (FIG. 6), the falling timing of the clock signal CK (for example, a timing t22) is earlier than the transition timing of the data signal DT1 (for example, a timing t23). Accordingly, the data signal DT1 (in this example, the data $Q_n$) at a timing earlier than this transition timing of the data signal DT1 appears in the signal D1. The signal D1 (the data $Q_n$) in a period from the timing t22 to a timing t25 is the same as the data signal DT2 (the data $Q_n$) in a period from the timing t21 to a timing t24.

On the other hand, in the case where the phase of the clock signal CK is delayed (FIG. 7), the falling timing of the clock signal CK (for example, a timing t33) is later than the transition timing of the data signal DT1 (for example, a timing t32). Accordingly, the data signal DT1 (in this example, the data $Q_{n+1}$) at a timing later than this transition timing of the data signal DT1 appears in the signal D1. The signal D1 (the data $Q_{n+1}$) in a period from the timing t33 to a timing t35 is the same as the data signal DT2 (the data $Q_{n+1}$) in a period from a timing t34 to a timing t36.

In such a manner, the flip-flop circuits 11 and 12 sample the data signal DT1 and thereby generate the data signal DT2 and the signal D1, respectively. Further, the control circuit 40 described next makes a comparison between the data signal DT1 and the signal D1, and thereby generates the control signals CTLP and CTLF.

The control circuit 40 generates the control signals CTLP and CTLF based on the data signal DT2, the signal D1, and the clock signal CK.

Figure 8:
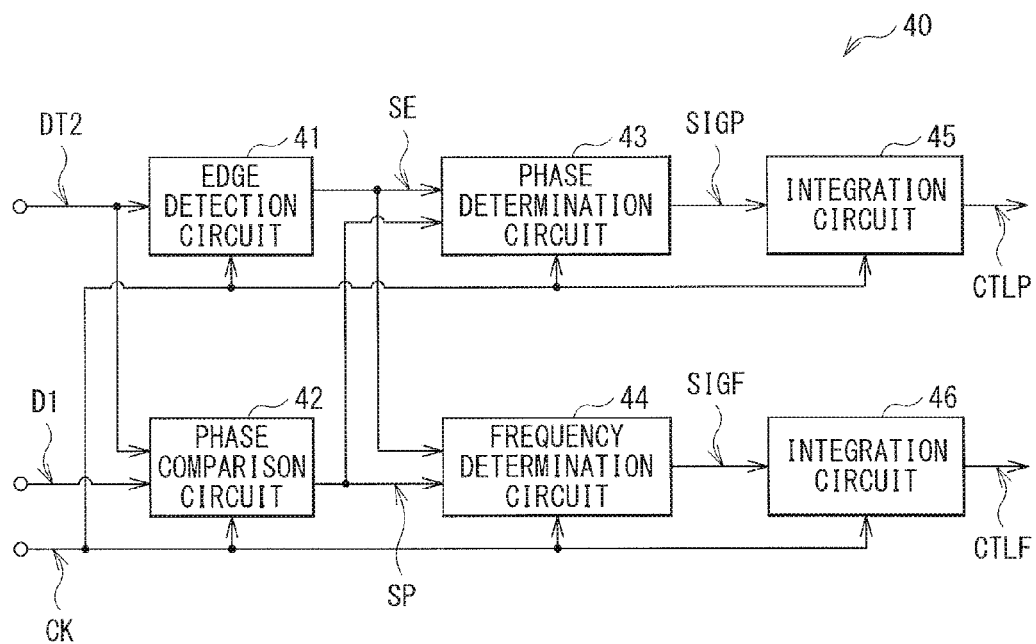
FIG. 8 is a block diagram illustrating a configuration example of a control circuit according to the first embodiment.

FIG. 8 illustrates a configuration example of the control circuit 40. The control circuit 40 may include an edge detection circuit 41, a phase comparison circuit 42, a phase determination circuit 43, a frequency determination circuit 44, and integration circuits 45 and 46.

The edge detection circuit 41 detects a rising edge and a falling edge of the data signal DT2 based on the data signal DT2 and the clock signal CK. Further, the edge detection circuit 41 generates an edge detection signal SE that becomes enable when the edge detection circuit 41 detects an edge.

The phase comparison circuit 42 determines whether the phase of the clock signal CK is advanced or delayed based on the data signal DT2, the signal D1, and the clock signal CK, and generates a phase comparison signal SP based on a result of the determination. More specifically, as illustrated in FIGS. 6 and 7, the phase comparison circuit 42 makes a comparison between data of the data signal DT2 and data of the signal D1, and thereby determines whether the phase of the clock signal CK is advanced or delayed. When the phase comparison circuit 42 determines that the phase of the clock signal CK is advanced as illustrated in FIG. 6, the phase comparison circuit 42 sets the phase comparison signal SP to "1". When the phase comparison circuit 42 determines that the phase of the clock signal CK is delayed as illustrated in FIG. 7, the phase comparison circuit 42 sets the phase comparison signal SP to "0".

The phase determination circuit 43 generates a signal SIGP based on the edge detection signal SE, the phase comparison signal SP, and the clock signal CK. More specifically, the phase determination circuit 43 sets the signal SIGP to "+1" when the phase determination circuit 43 determines that the phase of the clock signal CK is supposed to be delayed because the phase of the clock signal CK is advanced. The phase determination circuit 43 sets the signal SIGP to "−1" when the phase determination circuit 43 determines that the phase of the clock signal CK is supposed to be advanced because the phase of the clock signal CK is delayed. The phase determination circuit 43 sets the signal SIGP to "0" when the phase determination circuit 43 determines that the phase of the clock signal CK is supposed to be kept as it is.

The integration circuit 45 functions as a so-called loop filter, and integrates values of the signal SIGP. Further, the integration circuit 45 generates the control signal CTLP based on the integrated value, and supplies the control signal CTLP to the variable delay circuit 20.

The frequency determination circuit 44 generates a signal SIGF based on the edge detection signal SE, the phase comparison signal SP, and the clock signal CK. More specifically, the frequency determination circuit 44 sets the signal SIGF to "+1" when the frequency determination circuit 44 determines that the frequency of the clock signal CK is supposed to be lower because the frequency of the clock signal CK is high. The frequency determination circuit 44 sets the signal SIGF to "−1" when the frequency determination circuit 44 determines that the frequency of the clock signal CK is supposed to be higher because the frequency of the clock signal CK is low. The frequency determination circuit 44 sets the signal SIGF to "0" when the frequency determination circuit 44 determines that the frequency of the clock signal CK is supposed to be kept as it is.

The integration circuit 46 functions as a so-called loop filter, and integrates values of the signal SIGF. Further, the integration circuit 46 generates the control signal CTLF based on the integrated value, and supplies the control signal CTLF to the oscillator circuit 30.

In this embodiment, the edge detection circuit 37 corresponds to a specific but non-limiting example of "transition detection section" in the present disclosure. The delay circuits 31 to 35 and the AND circuit 36 correspond to specific but non-limiting examples of "oscillation section" in the present disclosure. The variable delay circuit 20 corresponds to a specific but non-limiting example of "delay section" in the present disclosure. The flip-flop circuit 11 corresponds to a specific but non-limiting example of "first sampling section" in the present disclosure. The flip-flop circuit 12 and the control circuit 40 correspond to specific but non-limiting examples of "control section" in the present disclosure. The flip-flop circuit 12 corresponds to a specific but non-limiting example of "second sampling section" in the present disclosure. The control circuit 40 corresponds to a specific but non-limiting example of "signal generation section" in the present disclosure. The data signal DT corresponds to a specific but non-limiting example of "input data signal" in the present disclosure. The data signal DT2 corresponds to a specific but non-limiting example of "output data signal" in the present disclosure. The control signal CTLF corresponds to a specific but non-limiting example of "first control signal" in the present disclosure. The control signal CTLP corresponds to a specific but non-limiting example of "second control signal" in the present disclosure.

[Operation and Function]

Next, an operation and a function of the reception unit 1 of the first embodiment are described.

[Outline of General Operation]

First, referring to FIG. 1, etc., an outline of a general operation of the reception unit 1 is described. The variable delay circuit 20 delays the data signal DT by the delay amount in accordance with the control signal CTLP, and outputs the delayed signal as the data signal DT1. The oscillator circuit 30 generates the clock signal CK having the frequency in accordance with the control signal CTLF, and varies the phase of the generated clock signal CK based on the data signal DT. The flip-flop circuit 11 samples the data signal DT1 at the rising timing of the clock signal CK, and thereby generates the data signal DT2. The flip-flop circuit 12 samples the data signal DT1 at the falling timing of the clock signal CK, and thereby generates the signal D1. The control circuit 40 generates the control signals CTLP and CTLF based on the data signal DT2, the signal D1, and the clock signal CK.

[Detailed Operation]

Figure 9:
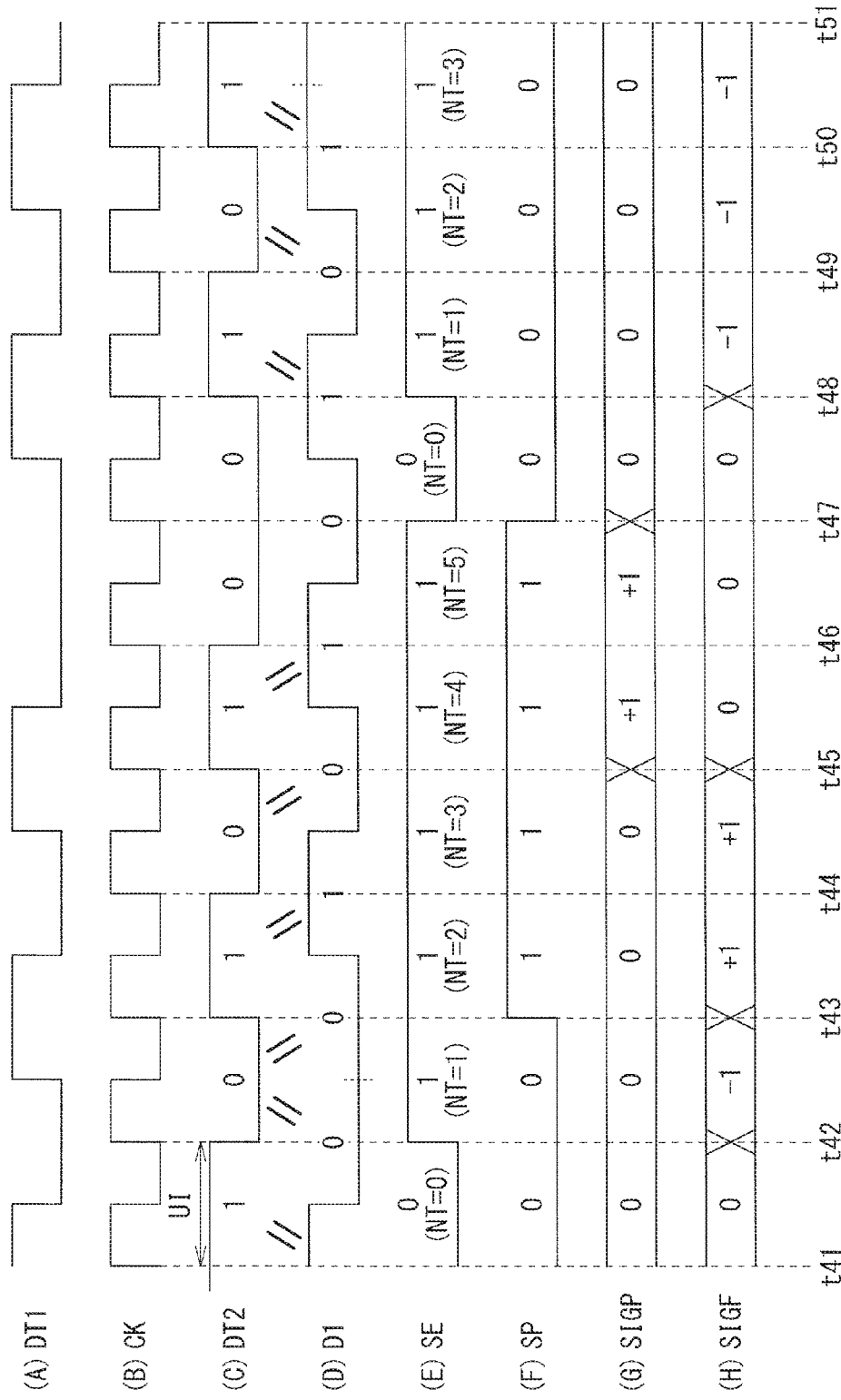
FIG. 9 is a timing waveform chart illustrating an operation example of a reception unit according to the first embodiment.

FIG. 9 illustrates an operation example of the reception unit 1, in which (A) illustrates the waveform of the data signal DT1, (B) illustrates the waveform of the clock signal CK, (C) illustrates the waveform of the data signal DT2, (D) illustrates the waveform of the signal D1, (E) illustrates a waveform of the edge detection signal SE, (F) illustrates a waveform of the phase comparison signal SP, (G) illustrates the signal SIGP, and (H) illustrates the signal SIGF. In (C) to (F) of FIG. 9, "1" and "0" are denoted in addition to the waveforms for the sake of convenience in description. "1" indicates that a signal attached with "1" is at a high level, and "0" indicates that a signal attached with "0" is at a low level. Also, the number of toggles NT (described later) is also denoted in (E) of FIG. 9.

The flip-flop circuit 11 samples the data signal DT1 at the rising timing of the clock signal CK, and thereby generates the data signal DT2 ((C) of FIG. 9). The flip-flop circuit 12 samples the data signal DT1 at the falling timing of the clock signal CK, and thereby generates the signal D1 ((D) of FIG. 9).

The edge detection circuit 41 in the control circuit 40 detects the rising edge and the falling edge of the data signal DT2, and thereby generates the edge detection signal SE ((E) of FIG. 9). More specifically, for example, because the data signal DT2 makes a transition at a timing t42, the edge detection circuit 41 sets the edge detection signal SE to a high level (to be enable) in a period from the timing t42 to a timing t43. The same applies to a period from the timing t43 to a timing t47. Also, for example, because the data signal DT2 makes no transition before or after the timing t47, the edge detection circuit 41 sets the edge detection signal SE to a low level in a period from the timing t47 to a timing t48. Also, for example, because the data signal DT2 makes a transition at the timing t48, the edge detection circuit 41 sets the edge detection signal SE to the high level (to be enable) in a period from the timing t48 to a timing t49. The same applies to a period from the timing t49 to a timing t51.

The phase comparison circuit 42 makes a comparison between the data signal DT2 and the signal D1, and thereby generates the phase comparison signal SP ((F) of FIG. 9). More specifically, because the signal D1 ("0") at the timing t42 is the same as the data signal DT2 ("0") in the period from the timing t42 to the timing t43, the phase comparison circuit 42 determines that the phase of the clock signal CK is delayed as in the case illustrated in FIG. 7, and sets the phase comparison signal SP in the period from the timing t42 to the timing t43 to "0". Also, for example, because the signal D1 ("0") at the timing t43 is the same as the data signal DT2 ("0") in the period from the timing t42 to the timing t43, the phase comparison circuit 42 determines that the phase of the clock signal CK is advanced as in the case illustrated in FIG. 6, and sets the phase comparison signal SP in a period from the timing t43 to the timing t44 to "1". The same applies to a period from the timing t44 to the timing t47. Also, for example, because the signal D1 ("1") at the timing t48 is the same as the data signal DT2 ("1") in the period from the timing t48 to the timing t49, the phase comparison circuit 42 determines that the phase of the clock signal CK is delayed as in the case illustrated in FIG. 7, and sets the phase comparison signal SP in the period from the timing t48 to the timing t49 to "0". The same applies to the period from the timing t49 to the timing t51.

It is to be noted that, because the signal D1 ("0") at the timing t47 is the same as both of the data signal DT2 ("0") in the period from the timing t46 to the timing t47 and the data signal DT2 ("0") in the period from the timing t47 to the timing t48, the phase comparison circuit 42 sets the phase comparison signal SP in the period from the timing t47 to the timing t48 to "0" in this example.

The phase determination circuit 43 generates the signal SIGP based on the edge detection signal SE and the phase comparison signal SP ((G) of FIG. 9). More specifically, the phase determination circuit 43 first counts the number of unit intervals UI in which the edge detection signal SE is continuously enable, and thereby acquires the number of toggles NT in a case where the data signal DT2 toggles alternately on a unit-interval UI unit basis ((E) of FIG. 9). The phase determination circuit 43 sets the signal SIGP to "0" when the number of toggles NT is less than predetermined number (in this example, 4). Also, the phase determination circuit 43 generates the signal SIGP based on the phase comparison signal SP when the number of toggles NT is equal to or greater than the predetermined number (in this example, 4). At this time, the phase determination circuit 43 sets the signal SIGP to "+1" when the phase comparison signal SP is "1", and sets the signal SIGP to "−1" when the phase comparison signal SP is "0". Also, the phase determination circuit 43 sets the signal SIGP to "0" when the edge detection signal SE is "0". In other words, the phase determination circuit 43 sets the signal SIGP to "0" when the data signal DT2 makes no transition.

In this example, the number of toggles NT is equal to or greater than "4" in a period from the timing t45 to the timing t47. Accordingly, the phase determination circuit 43 sets the signal SIGP to "+1" based on the phase comparison signal SP ("1") in this period from the timing t45 to the timing t47. Also, the phase determination circuit 43 sets the signal SIGP to "0" in other periods.

The integration circuit 45 integrates the signal SIGP, and thereby generates the control signal CTLP. Further, the variable delay circuit 20 varies the delay amount based on the generated control signal CTLP. In such a manner, negative feedback control is so performed on the delay amount of the variable delay circuit 20 that the falling timing of the clock signal CK coincides with the transition timing of the data signal DT1 in the reception unit 1.

The frequency determination circuit 44 generates the signal SIGF based on the edge detection signal SE and the phase comparison signal SP ((H) of FIG. 9). More specifically, the frequency determination circuit 44 first acquires the number of toggles NT in a manner similar to that in the phase determination circuit 43. Further, the frequency determination circuit 44 sets the signal SIGF to "0" when the number of toggles NT is equal to or greater than the predetermined number (in this example, 4). The frequency determination circuit 44 generates the signal SIGF based on the edge detection signal SE and the phase comparison signal SP when the number of toggles NT is less than the predetermined number. At this time, the frequency determination circuit 44 sets the signal SIGF to "0" when the edge detection signal SE is "0". In other words, the frequency determination circuit 44 sets the signal SIGF to "0" when the data signal DT2 makes no transition. In the case where the edge detection signal SE is "1", the frequency determination circuit 44 sets the signal SIGF to "+1" when the phase comparison signal SP is "1", and sets the signal SIGF to "−1" when the phase comparison signal SP is "0".

In this example, the number of toggles NT is less than "4" in a period from the timing t41 to the timing t45. In this period, in the period from the timing t41 to the timing t42, the frequency determination circuit 44 sets the signal SIGF to "0", because the edge detection signal SE is "0". In the period from the timing t42 to the timing t43, the frequency determination circuit 44 sets the signal SIGF to "−1", because the edge detection signal SE is "1" and the phase comparison signal SP is "0". In the period from the timing t43 to the timing t45, the frequency determination circuit 44 sets the signal SIGF to "+1", because the edge detection signal SE is "1" and the phase comparison signal SP is "1".

In the period from the timing t45 to the timing t47, because the number of toggles NT is equal to or greater than "4", the frequency determination circuit 44 sets the signal SIGF to "0".

In a period from the timing t47 to the timing t51, the number of toggles NT is less than "4". In this period, in the period from the timing t47 to the timing t48, the frequency determination circuit 44 sets the signal SIGF to "0", because the edge detection signal SE is "0". In the period from the timing t48 to the timing t50, the frequency determination circuit 44 sets the signal SIGF to "−1", because the edge detection signal SE is "1" and the phase comparison signal SP is "0".

The integration circuit 46 integrates the signal SIGF, and thereby generates the control signal CTLF. Further, the oscillator circuit 30 varies the frequency of the clock signal CK based on the generated control signal CTLF. In such a manner, negative feedback control is so performed on the frequency of the clock signal CK that the value of the frequency of the clock signal CK becomes the same as the value of the bit rate of the data signal DT.

In such a manner, in the reception unit 1, the frequency of the clock signal CK is controlled based on the data signal DT2 and the signal D1. As a result, for example, unlike the circuit disclosed in Japanese Unexamined Patent Application Publication No. H8-213979, it is possible to control the frequency of the clock signal without using a reference clock signal. Accordingly, it is possible to make the configuration of the entire system including the reception unit 1 simple. To give an example, a configuration without a circuit that generates the reference clock signal may be employed.

Moreover, in the reception unit 1, the variable delay circuit 20 is provided, and the control circuit 40 controls the delay amount of the variable delay circuit 20. As a result, the transition timing of the data signal DT1 inputted to the flip-flop circuit 11 is allowed to coincide with the falling timing of the clock signal CK inputted to the flip-flop circuit 11. In other words, if the variable delay circuit 20 is not provided, the transition timing of the data signal DT1 may not coincide with the falling timing of the clock signal CK. Further, for example, as in the circuit disclosed in Japanese Unexamined Patent Application Publication No. 2009-239510, these timings may not coincide with each other even when a replica circuit is inserted to adjust the timings. In such a case, even when the value of the frequency of the clock signal CK is almost the same as the value of the bit rate of the data signal DT, the control circuit 40 determines that the value of the frequency of the clock signal CK is different from the value of the bit rate of the data signal DT, and therefore controls the frequency of the clock signal CK. This causes a malfunction. On the other hand, in the reception unit 1, the variable delay circuit 20 is provided, and the control circuit 40 controls the delay amount of the variable delay circuit 20 based on the data signal DT2 and the signal D1. Accordingly, it is possible to adjust the delay amount to be a desired amount based on the result of the phase comparison performed by the phase comparison circuit 42, which reduces possibility that such a malfunction is caused. As a result, it is possible to decrease an error rate of the received data, and to therefore improve the communication quality.

Moreover, in the reception unit 1, the phase determination circuit 43 generates the signal SIGP based on the phase comparison signal SP when the number of toggles NT is equal to or greater than the predetermined number. Accordingly, it is possible to effectively control the delay amount of the variable delay circuit 20. Specifically, first, when the number of toggles NT is equal to or greater than the predetermined number, the data signal DT toggles alternately on the unit-interval UI unit basis in a period corresponding to the predetermined number. In such a case, the oscillator circuit 30 corrects the phase of the clock signal CK based on the data signal DT in each of the unit intervals UI. In other words, the phase of the clock signal CK is corrected sufficiently with use of the data signal DT. In such a case, the frequency of the clock signal CK less influences the phase comparison signal SP accordingly, and a difference between the delay amount of the variable delay circuit 20 and a desired delay amount thereof is reflected to the phase comparison signal SP as a result. More specifically, for example, when the delay amount of the variable delay circuit 20 is smaller than the desired delay amount, the phase of the data signal DT1 is advanced, and the phase of the clock signal CK is therefore delayed relatively, which causes the phase comparison signal SP to be "0". For example, when the delay amount of the variable delay circuit 20 is larger than the desired delay amount, the phase of the data signal DT1 is delayed, and the phase of the clock signal CK is therefore advanced relatively, which causes the phase comparison signal SP to be "1". In the reception unit 1, the phase determination circuit 43 generates the signal SIGP based on the phase comparison signal SP when the number of toggles NT is equal to or greater than the predetermined number. As a result, it is possible to effectively control the delay amount of the variable delay circuit 20 in the reception unit 1.

Moreover, in the reception unit 1, the frequency determination circuit 44 generates the signal SIGF based on the phase comparison signal SP when the number of toggles NT is less than the predetermined number. As a result, it is possible to effectively control the frequency of the clock signal CK. Specifically, in the reception unit 1, in the case where the data signal DT toggles alternately on the unit-interval UI unit basis, the oscillator circuit 30 corrects the phase of the clock signal CK based on the data signal DT in each of the unit intervals UI, as described above. In other words, the clock signal CK toggles in response to the transition of the data signal DT irrespective of the setting of the frequency set with use of the control signal CTLF. Accordingly, if the frequency determination circuit 44 operates based on such a clock signal CK, the frequency determination circuit 44 may determine that the value of the frequency of the clock signal CK is the same as the value of the bit rate of the data signal DT even when these values are different from each other, for example. For this reason, the frequency of the clock signal CK may not be controlled effectively. On the other hand, in the reception unit 1, the frequency determination circuit 44 generates the signal SIGF based on the phase comparison signal SP when the number of toggles NT is less than the predetermined number, and such an error in determination is not caused accordingly. As a result, it is possible to effectively control the frequency of the clock signal CK.

[Effects]

As described above, in the first embodiment, the variable delay circuit is provided, and the control circuit controls the delay amount of the variable delay circuit. This allows the transition timing of the data signal inputted to the flip-flop circuit to coincide with the falling timing of the clock signal inputted to the flip-flop circuit. As a result, it is possible to reduce the possibility of causing a malfunction, and to therefore reduce the error rate of the received data. As a result, it is possible to improve the communication quality.

Moreover, in the first embodiment, the phase determination circuit generates the signal SIGP based on the phase comparison signal when the number of toggles is equal to or greater than the predetermined number. Accordingly, it is possible to effectively control the delay amount of the variable delay circuit. As a result, it is possible to improve the communication quality.

Moreover, in the first embodiment, the frequency determination circuit generates the signal SIGF based on the phase comparison signal when the number of toggles is less than the predetermined number. Accordingly, it is possible to effectively control the frequency of the clock signal CK. As a result, it is possible to improve the communication quality.

[Modification 1-1]

Figure 10:
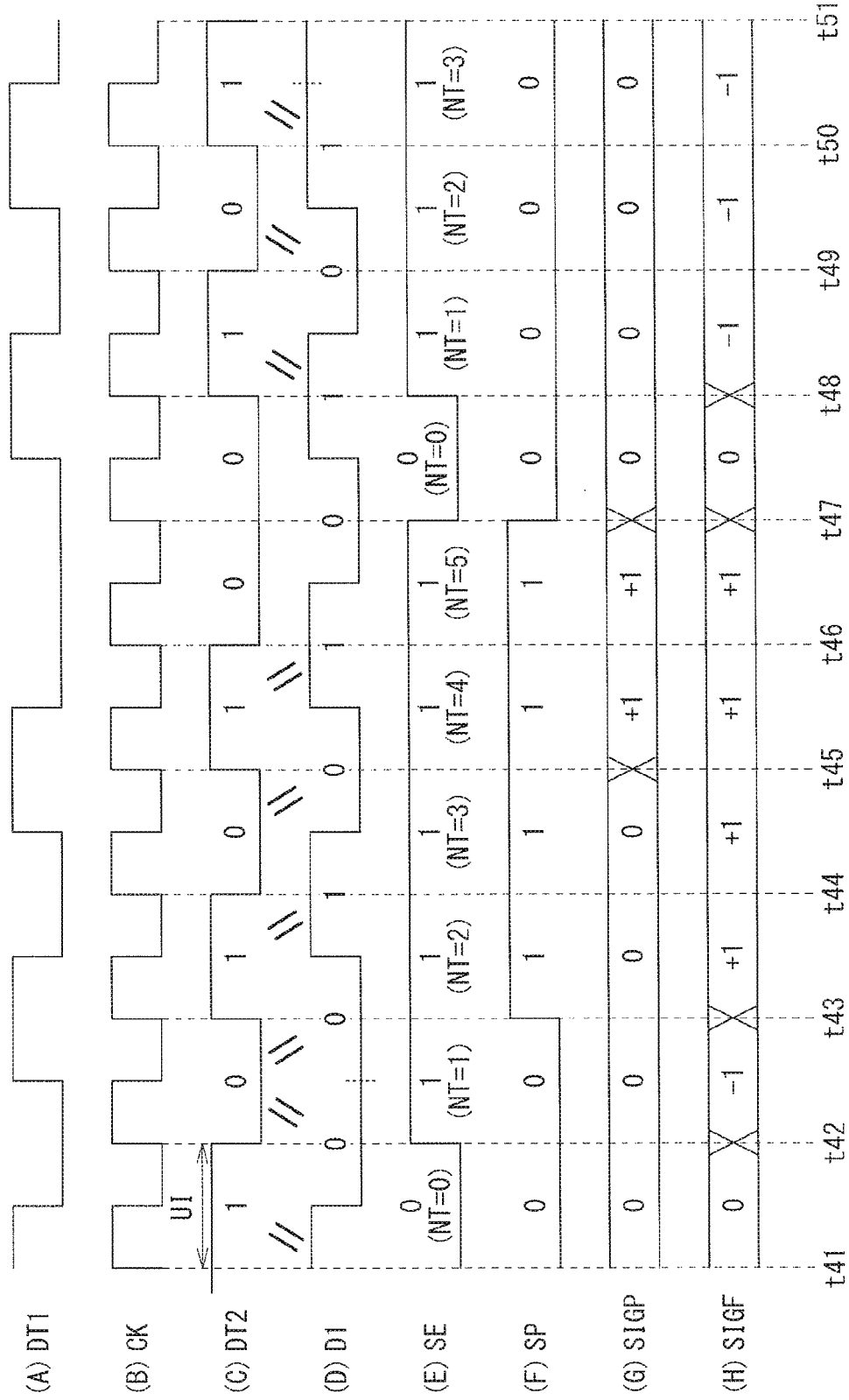
FIG. 10 is a timing waveform chart illustrating an operation example of a reception unit according to a modification of the first embodiment.

In the first embodiment described above, the frequency determination circuit 44 generates the signal SIGF based on the number of toggles NT; however, the method of generating the signal SIGF is not limited thereto. Alternatively, for example, as in a reception unit 1A illustrated in FIG. 10, the signal SIGF may be generated without using the number of toggles NT. A frequency determination circuit 44A in the reception unit 1A generates the signal SIGF based on the edge detection signal SE and the phase comparison signal SP ((H) of FIG. 10). More specifically, in a case where the edge detection signal SE is "0", the frequency determination circuit 44A sets the signal SIGF to "0". In a case where the edge detection signal SE is "1", the frequency determination circuit 44A sets the signal SIGF to "+1" when the phase comparison signal SP is "1", and sets the signal SIGF to "−1" when the phase comparison signal SP is "0". Also when such a configuration is employed, it is possible to improve the communication quality in the reception unit 1A.

[Modification 1-2]

In the first embodiment described above, the phase determination circuit 43 and the frequency determination circuit 44 generate the signals SIGP and SIGF, respectively, based on the number of toggles NT; however, the method of generating the signals SIGP and SIFG is not limited thereto. Alternatively, for example, the signals SIGP and SIGF may be generated based on the number of digits NC in a case where an identical digit consecutively appears in the data signal DT2. The present modification is described below in detail.

Figure 11:
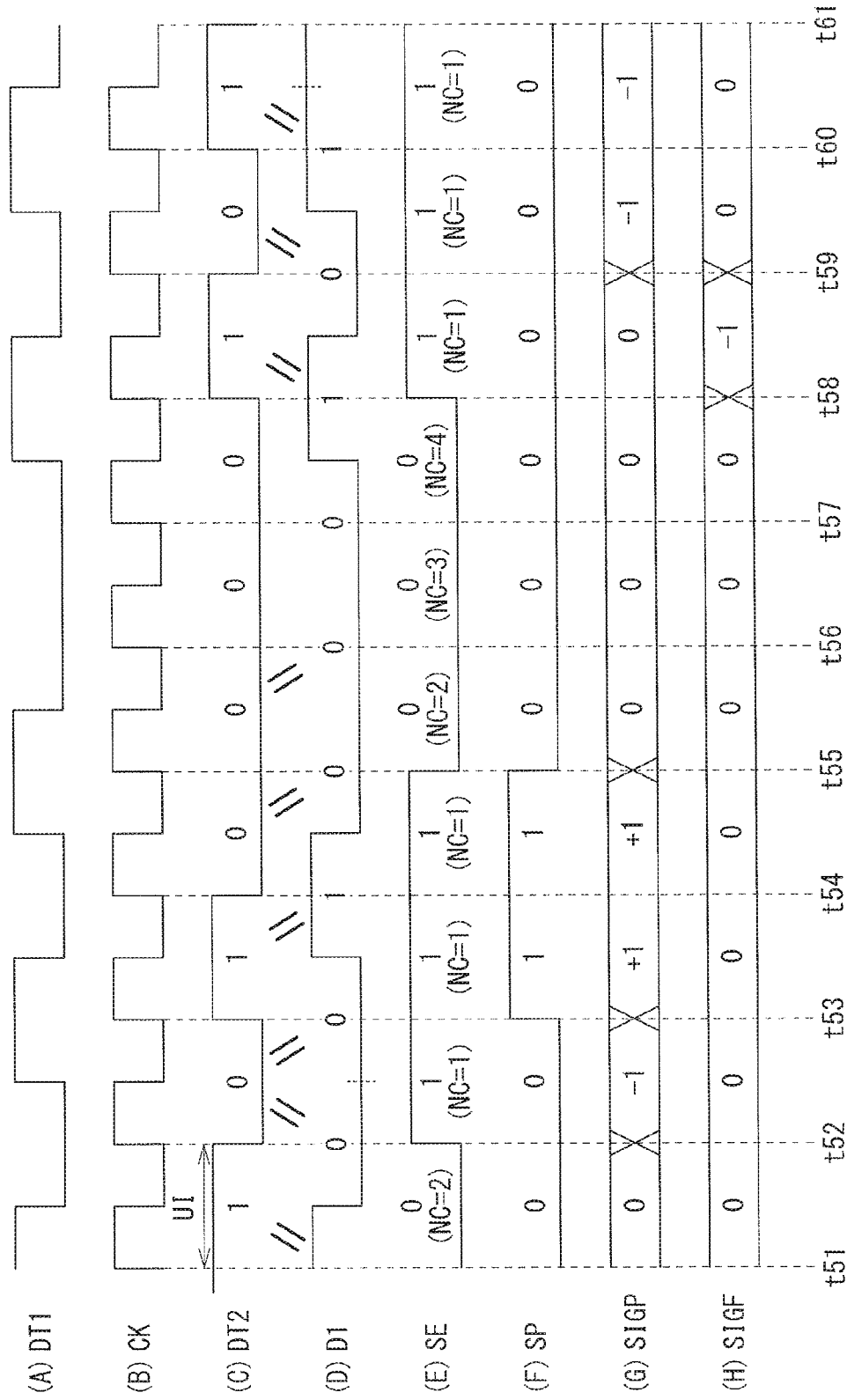
FIG. 11 is a timing waveform chart illustrating an operation example of a reception unit according to another modification of the first embodiment.

FIG. 11 illustrates an operation example of a reception unit 1B according to the present modification, in which (A) illustrates the waveform of the data signal DT1, (B) illustrates the waveform of the clock signal CK, (C) illustrates the waveform of the data signal DT2, (D) illustrates the waveform of the signal D1, (E) illustrates the waveform of the edge detection signal SE, (F) illustrates the waveform of the phase comparison signal SP, (G) illustrates the signal SIGP, and (H) illustrates the signal SIGF. The number of digits NC is also denoted in (E) of FIG. 11.

A frequency determination circuit 44B in the reception unit 1B generates the signal SIGF based on the edge detection signal SE and the phase comparison signal SP ((H) of FIG. 11). More specifically, the frequency determination circuit 44B first counts the number of unit intervals UI in which the edge detection signal SE are continuously set to "0", and thereby acquires the number of digits NC in the case where the identical digit consecutively appears in the data signal DT2 ((E) of FIG. 11). Further, in a case where the number of digits NC is equal to or greater than predetermined number (in this example, 4), the frequency determination circuit 44B generates the signal SIGF at a time when the edge detection signal SE first becomes "1" after the number of digits NC has become equal to or greater than the predetermined number, based on the phase comparison signal SP. In this case, the frequency determination circuit 44B sets the signal SIGF to "+1" when the phase comparison signal SP is "1", and sets the signal SIGF to "−1" when the phase comparison signal SP is "0". In other cases, the frequency determination circuit 44B sets the signal SIGF to "0".

In this example, in a period from a timing t58 to a timing t59, the frequency determination circuit 44B sets the signal SIGF to "−1", because the edge detection signal SE is "1", the number of digits NC in a period immediately before the period from the timing t58 to the timing t59 is equal to or greater than "4", and the phase comparison signal SP is "0". In other periods, the frequency determination circuit 44B sets the signal SIGF to "0".

The phase determination circuit 43B in the reception unit 1B generates the signal SIGP based on the edge detection signal SE and the phase comparison signal SP ((G) of FIG. 11). More specifically, the phase determination circuit 43B first acquires the number of digits NC in a manner similar to that in the frequency determination circuit 44B ((E) of FIG. 11). In a case where the acquired number of digits NC is equal to or greater than the predetermined number (in this example, 4), the phase determination circuit 43B sets the signal SIGP, at a time when the edge detection signal SE first becomes "1" after the number of digits NC has become equal to or greater than the predetermined number, to "0". In other cases, in a case where the edge detection signal SE is "1", the phase determination circuit 43B sets the signal SIGF to "+1" when the phase comparison signal SP is "1", and sets the signal SIGF to "−1" when the phase comparison signal SP is "0". In the case where the edge detection signal SE is "0", the phase determination circuit 43B sets the signal SIGP to "0".

In this example, in a period from a timing t51 to a timing t52, the phase determination circuit 43B sets the signal SIGP to "0", because the edge detection signal SE is "0". In a period from a timing t52 to a timing t53, the phase determination circuit 43B sets the signal SIGP to "−1", because the edge detection signal SE is "1", the number of digits NC in a period immediately before is less than "4", and the phase comparison signal SP is "0". In a period from the timing t53 to a timing t55, the phase determination circuit 43B sets the signal SIGP to "+1", because the edge detection signal SE is "1", and the phase comparison signal SP is "1". In a period from the timing t55 to the timing t58, the phase determination circuit 43B sets the signal SIGP to "0", because the edge detection signal SE is "0". In the period from the timing t58 to the timing t59, the phase determination circuit 43B sets the signal SIGP to "0", because the edge detection signal SE is "1", and the number of digits NC in a period immediately before is equal to or greater than "4". In a period from the timing t59 to a timing t61, the phase determination circuit 43B sets the signal SIGP to "−1", because the edge detection signal SE is "1", and the phase comparison signal SP is "0".

In such a manner, in the reception unit 1B, in the case where the number of digits NC is equal to or greater than the predetermined number, the frequency determination circuit 44B generates the signal SIGF, at the time when the edge detection signal SE first becomes "1" after the number of digits NC has become equal to or greater than the predetermined number, based on the phase comparison signal SP. As a result, it is possible to effectively control the frequency of the clock signal CK. In other words, in the case where the number of digits NC is equal to or greater than the predetermined number, the oscillator circuit 30 does not correct the phase of the clock signal CK during a period corresponding to that number of digits NC. Accordingly, when the data signal DT2 first makes a transition after the period corresponding to the number of digits NC, an influence of a difference between the frequency of the clock signal CK and the bit rate of the data signal DT on the phase comparison signal SP is made larger, whereas, an influence of a difference between the delay amount of the variable delay circuit 20 and the desired delay amount thereof on the phase comparison signal SP is made smaller. More specifically, for example, in a case where the frequency of the clock signal CK is higher than the bit rate of the data signal DT, the phase of the clock signal CK is advanced, and the phase comparison signal SP therefore becomes "1". For example, in a case where the frequency of the clock signal CK is lower than the bit rate of the data signal DT, the phase of the clock signal CK is delayed, and the phase comparison signal SP therefore becomes "0". In the reception unit 1B, the frequency determination circuit 44B generates the signal SIGF based on the phase comparison signal SP in the case where the number of digits NC is equal to or greater than the predetermined number. As a result, it is possible to effectively control the frequency of the clock signal CK.

Figure 12:
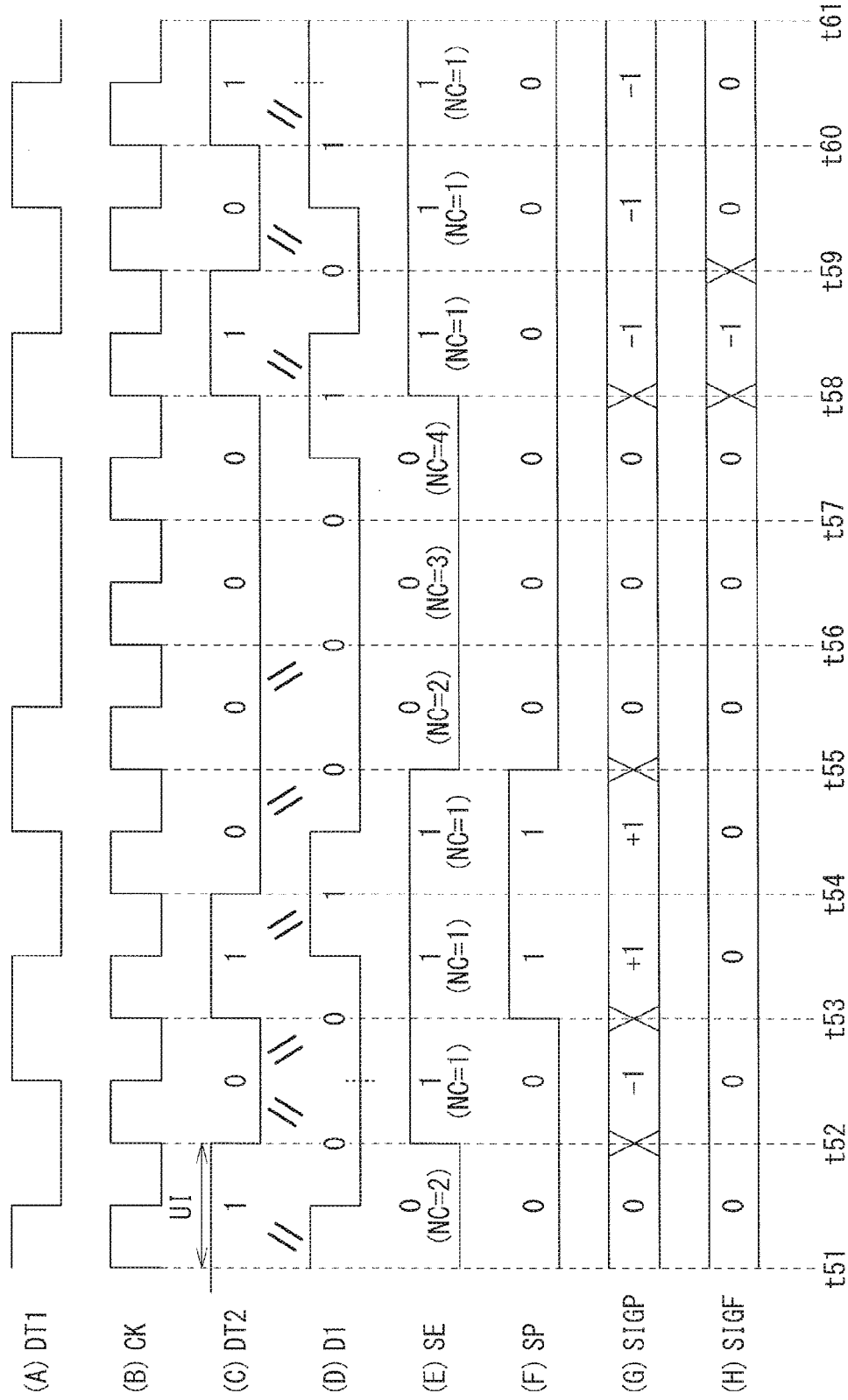
FIG. 12 is a timing waveform chart illustrating an operation example of a reception unit according to another modification of the first embodiment.

In the example described above, the phase determination circuit 43B generates the signal SIGP based on the number of digits NC; however, the method of generating the signal SIGP is not limited thereto. Alternatively, for example, as a reception unit 1C illustrated in FIG. 12, the signal SIGP may be generated without using the number of digits NC. A phase determination circuit 44C in the reception unit 1C generates the signal SIGP based on the edge detection signal SE and the phase comparison signal SP ((G) of FIG. 12). More specifically, in a case where the edge detection signal SE is "0", a phase determination circuit 43C sets the signal SIGP to "0". In a case where the edge detection signal SE is "1", the phase determination circuit 44C sets the signal SIGP to "+1" when the phase comparison signal SP is "1", and sets the signal SIGP to "−1" when the phase comparison signal SP is "0". Also when such a configuration is employed, it is possible to improve the communication quality in the reception unit 1C.

[Modification 1-3]

In the first embodiment described above, the oscillator circuit 30 is configured using the AND circuit 36; however, the configuration of the oscillator circuit 30 is not limited thereto. The present modification is described below referring to some examples.

Figure 13A:
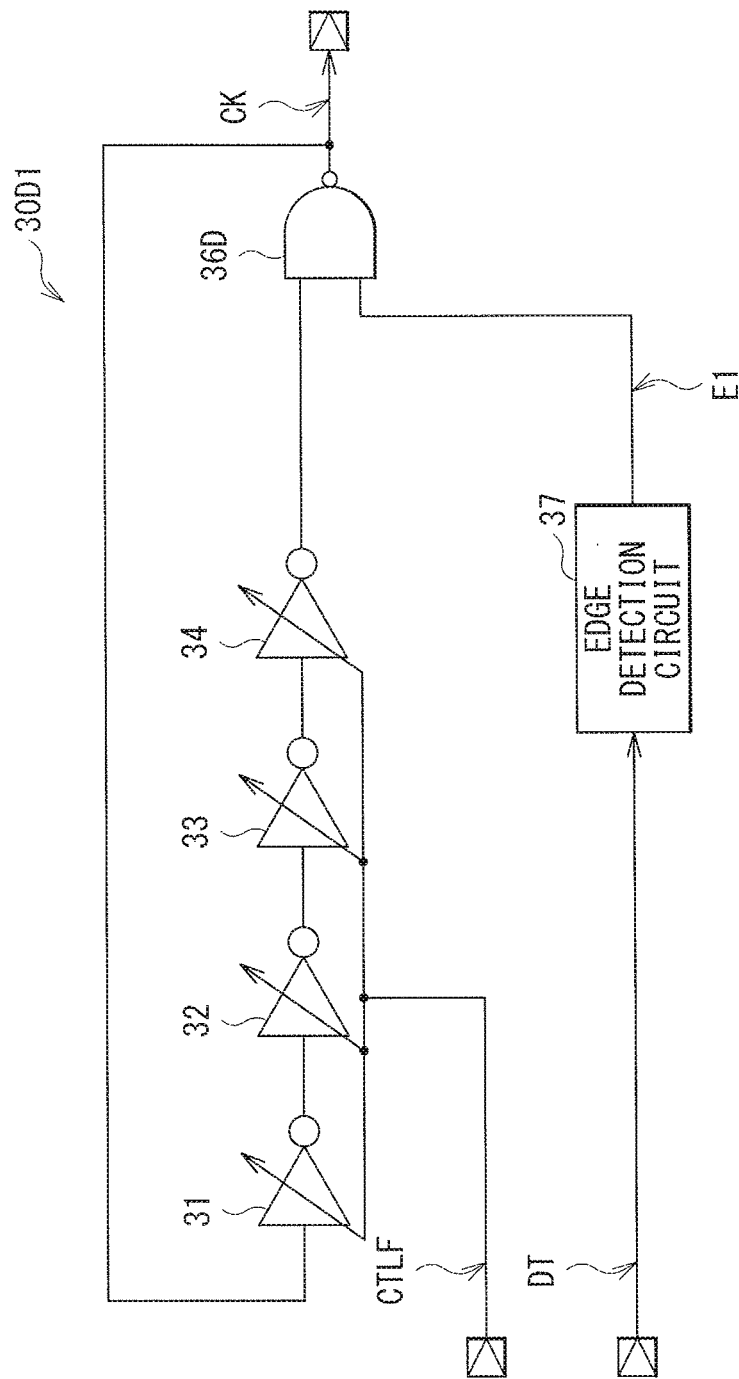
FIG. 13A is a block diagram illustrating a configuration example of an oscillator circuit according to another modification of the first embodiment.

FIG. 13A illustrates a configuration example of an oscillator circuit 30D1 according to the present modification. The oscillator circuit 30D1 includes four delay circuits 31 to 34 and a NAND circuit 36D. The NAND circuit 36D calculates an inverted logical product (NAND) of a signal supplied to a first input terminal thereof and a signal supplied to a second input terminal thereof, and outputs a result of the calculation as the clock signal CK. The first input terminal of the NAND circuit 36D is connected to an output terminal of the delay circuit 34, the second input terminal thereof is connected to the output terminal of the edge detection circuit 37 and is supplied with the signal E1, and an output terminal thereof is connected to the input terminal of the delay circuit 31. In the oscillator circuit 30D1, when the data signal DT makes a transition, the signal E1 is set to the low level for a predetermined period in response to the transition of the data signal DT, which causes the NAND circuit 36D to set the output signal (the clock signal CK) to the high level. In such a manner, the oscillator circuit 30D1 varies the phase of the clock signal CK based on the data signal DT.

Figure 13B:
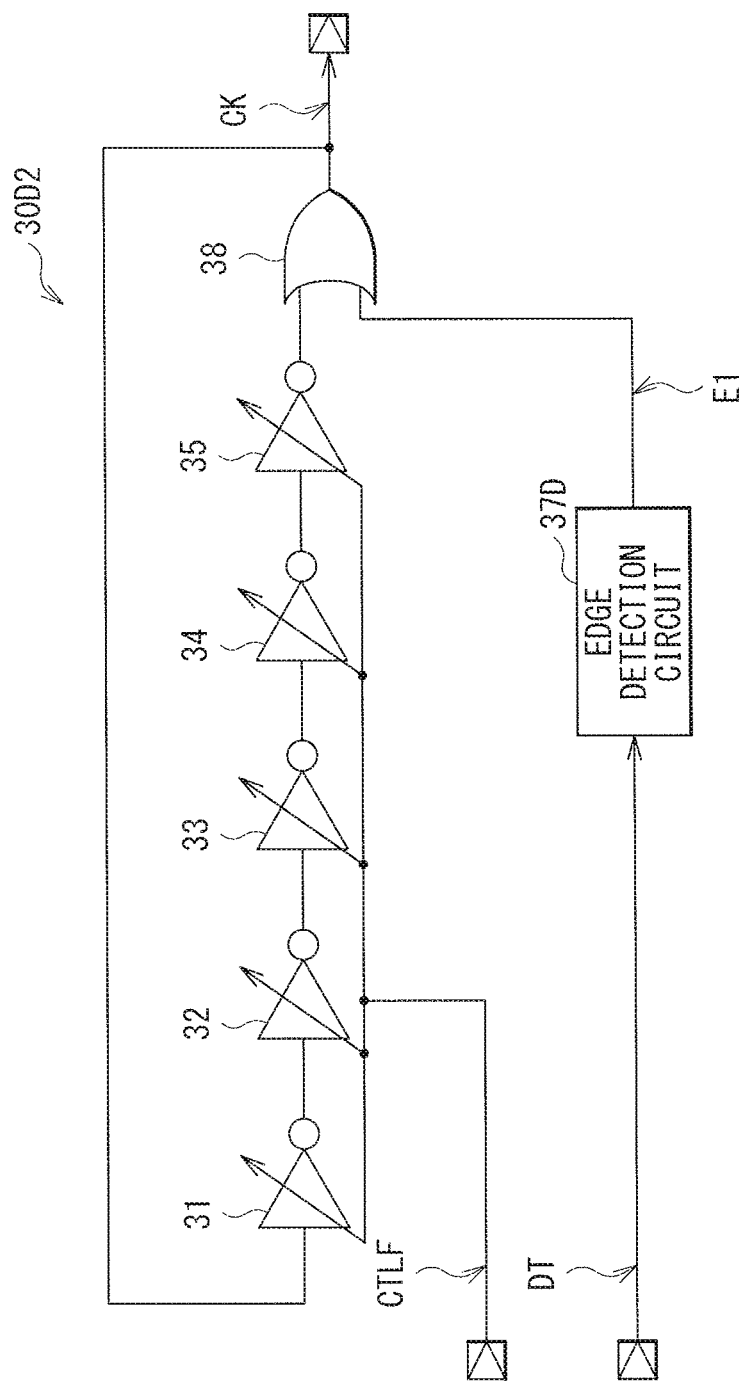
FIG. 13B is a block diagram illustrating a configuration example of an oscillator circuit according to another modification of the first embodiment.

FIG. 13B illustrates a configuration example of another oscillator circuit 30D2 according to the present modification. The oscillator circuit 30D2 includes an edge detection circuit 37D, five delay circuits 31 to 35, and an OR circuit 38. In a case where the data signal DT makes no transition, the edge detection circuit 37D sets the signal E1 to the low level. In a case where the data signal DT makes a transition, the edge detection circuit 37D sets the signal E1 to the high level in the period PG having a length that is about half of the bit length (the unit interval UI) of the data signal DT. The OR circuit 38 calculates a logical sum (OR) of a signal supplied to a first input terminal thereof and a signal supplied to a second input terminal thereof, and outputs a result of the calculation as the clock signal CK. The first input terminal of the OR circuit 38 is connected to the output terminal of the delay circuit 35, the second input terminal thereof is connected to an output terminal of the edge detection circuit 37D and is supplied with the signal E1, and an output terminal thereof is connected to the input terminal of the delay circuit 31. In the oscillator circuit 30D2, when the data signal DT makes a transition, the signal E1 is set to the high level for a predetermined period in response to the transition of the data signal DT, which causes the OR circuit 38 to set the output signal (the clock signal CK) to the high level. In such a manner, the oscillator circuit 30D2 varies the phase of the clock signal CK based on the data signal DT.

Figure 13C:
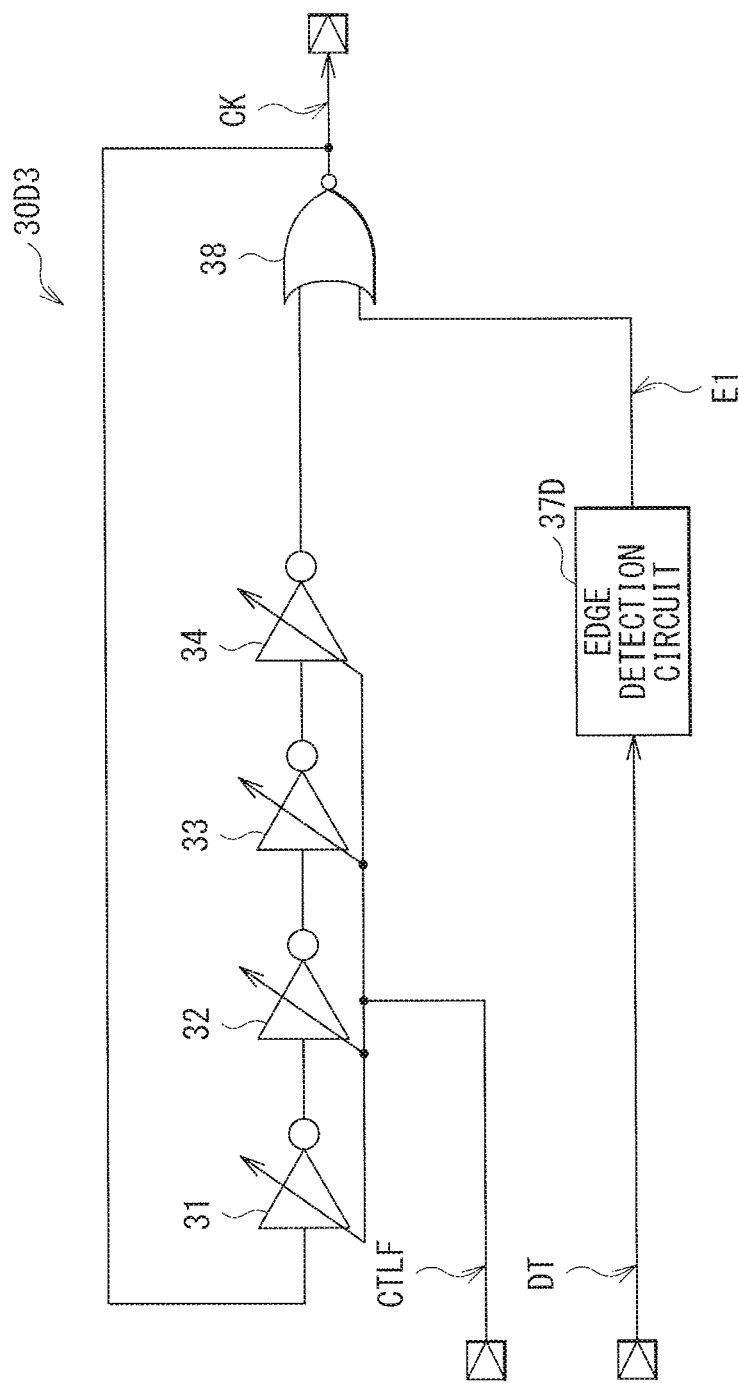
FIG. 13C is a block diagram illustrating a configuration example of an oscillator circuit according to another modification of the first embodiment.

FIG. 13C illustrates a configuration example of another oscillator circuit 30D3 according to the present modification. The oscillator circuit 30D3 includes the edge detection circuit 37D, the four delay circuits 31 to 34, and a NOR circuit 38D. The NOR circuit 38D calculates an inverted logical sum (NOR) of a signal supplied to a first input terminal thereof and a signal supplied to a second input terminal thereof, and outputs a result of the calculation as the clock signal CK. The first input terminal of the NOR circuit 38D is connected to the output terminal of the delay circuit 34, the second input terminal thereof is connected to the output terminal of the edge detection circuit 37D and is supplied with the signal E1, and an output terminal thereof is connected to the input terminal of the delay circuit 31. In the oscillator circuit 30D3, when the data signal DT makes a transition, the signal E1 is set to the high level for a predetermined period in response to the transition of the data signal DT, which causes the NOR circuit 38D to set the output signal (the clock signal CK) to the low level. In such a manner, the oscillator circuit 30D3 varies the phase of the clock signal CK based on the data signal DT.

[Modification 1-4]

Figure 14A:
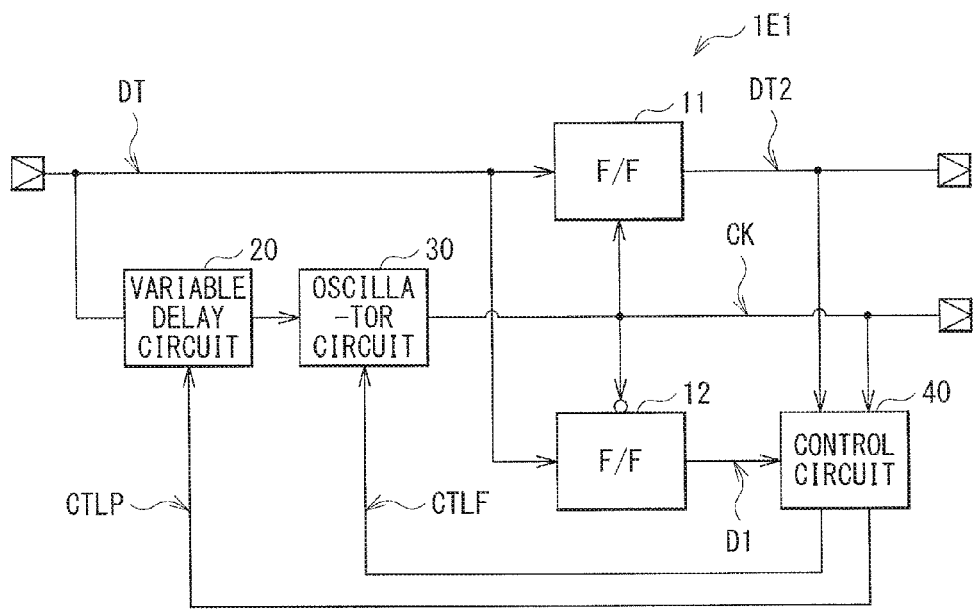
FIG. 14A is a block diagram illustrating a configuration example of a reception unit according to another modification of the first embodiment.
Figure 14B:
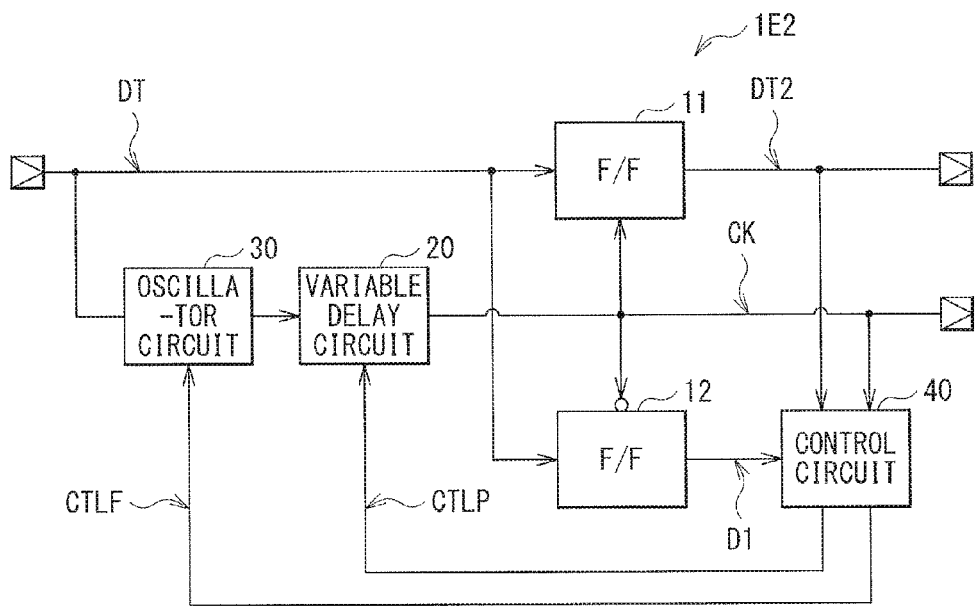
FIG. 14B is a block diagram illustrating a configuration example of a reception unit according to another modification of the first embodiment.

In the first embodiment described above, the variable delay circuit 20 is arranged upstream of the flip-flop circuits 11 and 12; however, the arrangement of the variable delay circuit 20 is not limited thereto. Alternatively, for example, as in a reception unit 1E1 illustrated in FIG. 14A, the variable delay circuit 20 may be arranged upstream of the oscillator circuit 30. Alternatively, for example, as in a reception unit 1E2 illustrated in FIG. 14B, the variable delay circuit 20 may be arranged downstream of the oscillator circuit 30. The output signal (the clock signal CK) of the variable delay circuit 20 may be thereby supplied to the flip-flop circuits 11 and 12 and the control circuit 40, and may be thereby supplied to a circuit downstream of the reception unit 1E2 via the output terminal of the variable delay circuit 20.

In the first embodiment described above, one variable delay circuit 20 is provided; however, the number of variable delay circuits is not limited thereto. Alternatively, for example, as in a reception unit 1F1 illustrated in FIG. 15A, a reception unit 1F2 illustrated in FIG. 15B, and a reception unit 1F3 illustrated in FIG. 15C, a plurality of variable delay circuits may be provided.

Figure 15A:
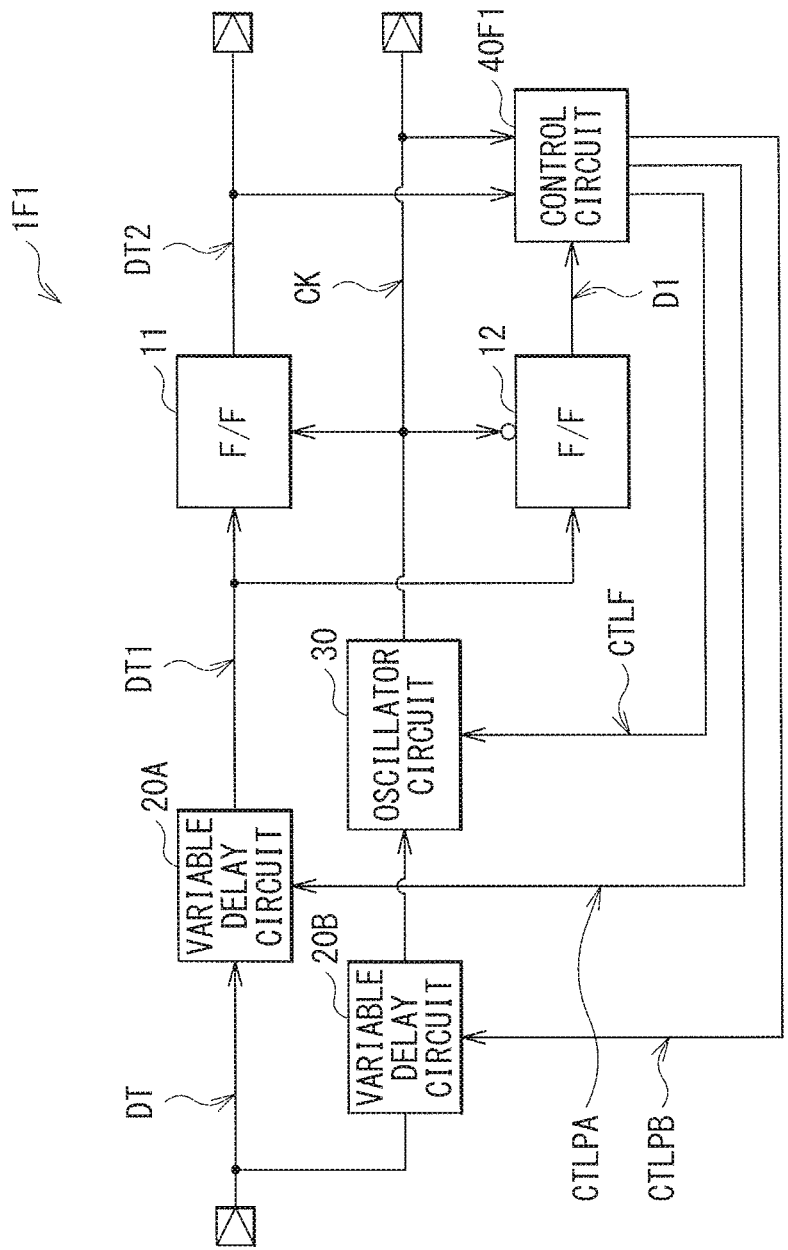
FIG. 15A is a block diagram illustrating a configuration example of a reception unit according to another modification of the first embodiment.

As illustrated in FIG. 15A, the reception unit 1F1 includes variable delay circuits 20A and 20B, and a control circuit 40F1. The variable delay circuit 20A delays the data signal DT by a delay amount in accordance with a control signal CTLPA, and supplies the delayed data signal to the flip-flop circuits 11 and 12. The variable delay circuit 20B delays the data signal DT by a delay amount in accordance with a control signal CTLPB, and supplies the delayed data signal to the oscillator circuit 30. The control circuit 40F1 generates the control signals CTLPA, CTLPB, and CTLF, based on the data signal DT2, the signal D1, and the clock signal CK.

Figure 15B:
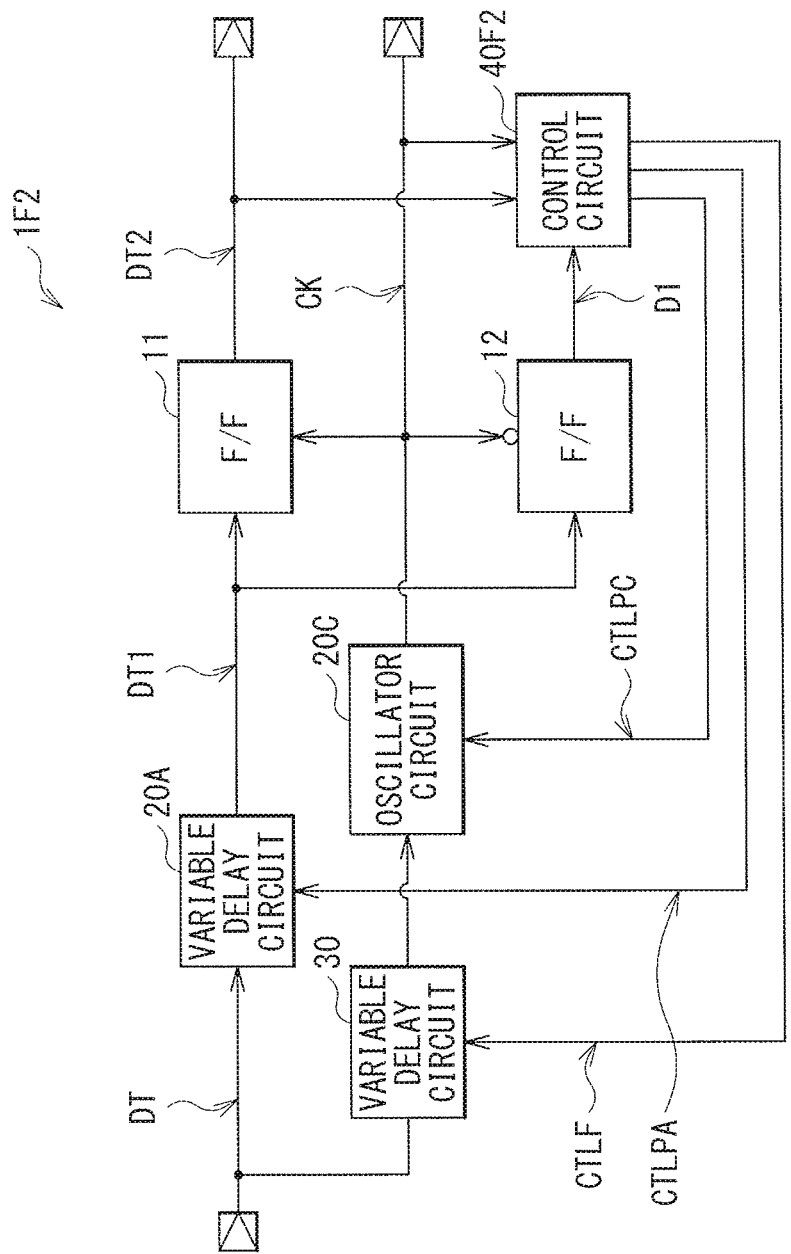
FIG. 15B is a block diagram illustrating a configuration example of a reception unit according to another modification of the first embodiment.

As illustrated in FIG. 15B, the reception unit 1F2 includes variable delay circuits 20A and 20C, and a control circuit 40F2. The variable delay circuit 20C delays the output signal of the oscillator circuit 30 by a delay amount in accordance with a control signal CTLPC, and outputs the delayed signal as the clock signal CK. The control circuit 40F2 generates the control signals CTLPA, CTLPC, and CTLF, based on the data signal DT2, the signal D1, and the clock signal CK.

Figure 15C:
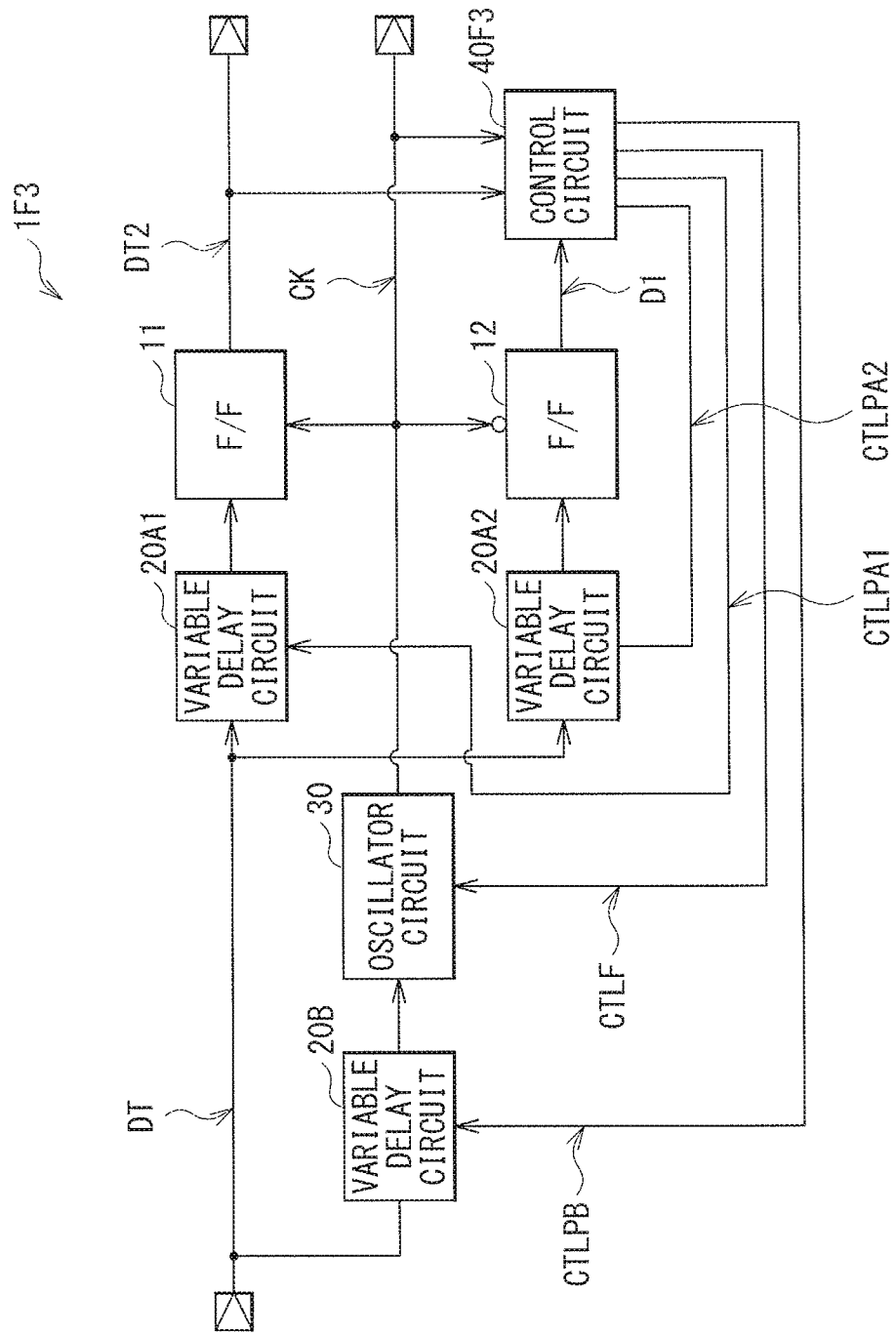
FIG. 15C is a block diagram illustrating a configuration example of a reception unit according to another modification of the first embodiment.

As illustrated in FIG. 15C, the reception unit 1F3 includes variable delay circuits 20A1, 20A2, and 20B, and a control circuit 40F3. The variable delay circuit 20A1 delays the data signal DT by a delay amount in accordance with a control signal CTLPA1, and supplies the delayed data signal to the flip-flop circuit 11. The variable delay circuit 20A2 delays the data signal DT by a delay amount in accordance with a control signal CTLPA2, and supplies the delayed data signal to the flip-flop circuit 12. The control circuit 40F3 generates the control signals CTLPA1, CTLPA2, CTLPB, and CTLF, based on the data signal DT2, the signal D1, and the clock signal CK.

[Modification 1-5]

In the first embodiment described above, the reception unit 1 has a configuration of a so-called full-rate architecture in which the value of the frequency of the clock signal CK is almost the same as the value of the bit rate of the data signal DT; however, the configuration of the reception unit is not limited thereto. Alternatively, for example, the reception unit may have a configuration of a so-called half-rate architecture in which the value of the frequency of the clock signal is almost the same as half of the value of the bit rate of the data signal DT, or may have a configuration of a so-called quarter-rate architecture in which the value of the frequency of the clock signal is almost the same as ¼ of the value of the bit rate of the data signal DT. The present modification is described below referring to a reception unit 1G having the half-rate architecture configuration, as an example.

Figure 16:
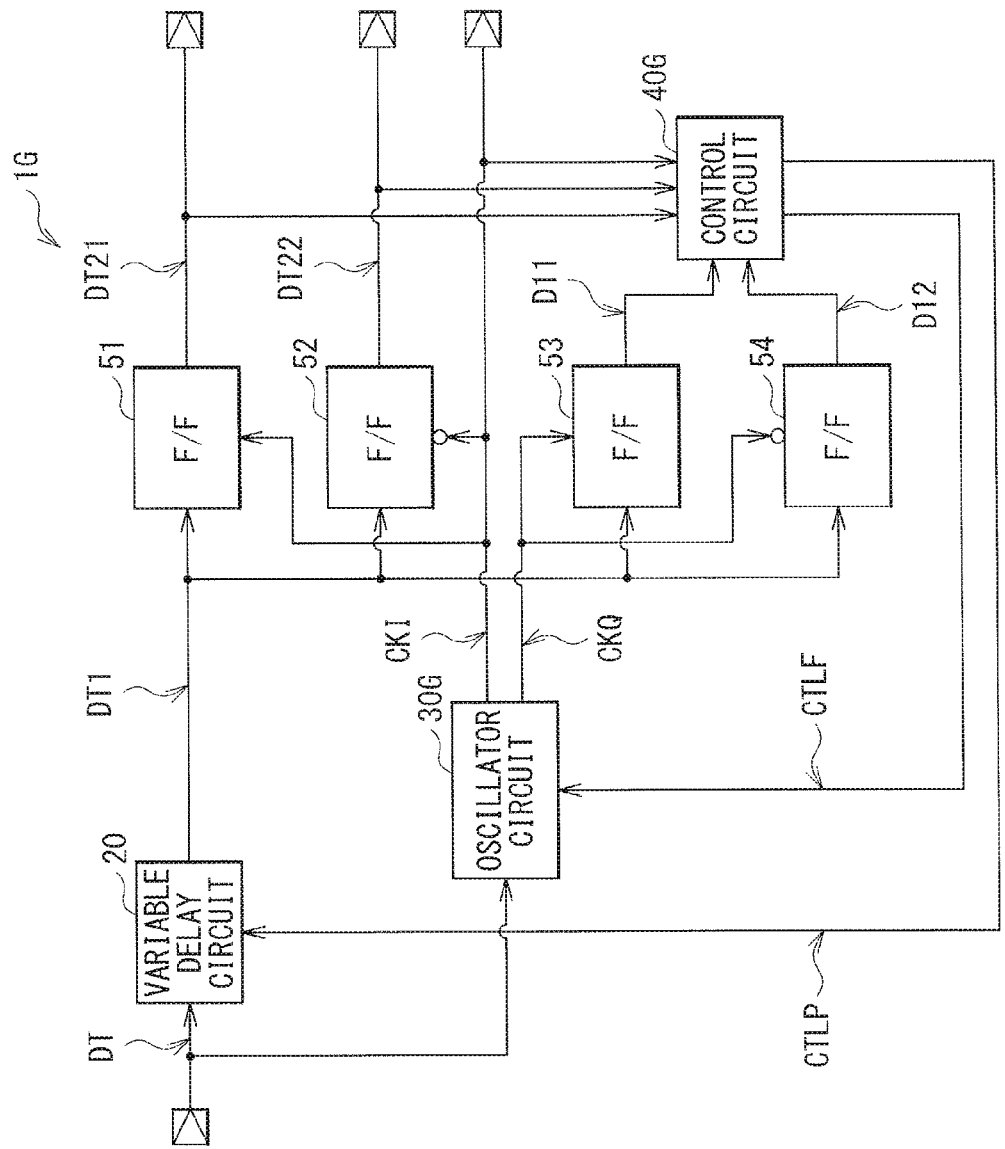
FIG. 16 is a block diagram illustrating a configuration example of a reception unit according to another modification of the first embodiment.

FIG. 16 illustrates a configuration example of the reception unit 1G. The reception unit 1G includes an oscillator circuit 30G, flip-flop circuits 51 to 54, and a control circuit 40G.

The oscillator circuit 30G generates two clock signals CKI and CKQ that have frequencies in accordance with the control signal CTLF. The clock signals CKI and CKQ are signals that have phases shifted by about 90 degrees from each other. Values of the frequencies of the clock signals CKI and CKQ are almost the same as half of the value of the bit rate of the data signal DT.

The flip-flop circuit 51 samples the data signal DT1 at a rising timing of the clock signal CKI, and thereby generates a data signal DT21. The flip-flop circuit 52 samples the data signal DT1 at a falling timing of the clock signal CKI, and thereby generates a data signal DT22. The flip-flop circuit 53 samples the data signal DT1 at a rising timing of the clock signal CKQ, and thereby generates a signal D11. The flip-flop circuit 54 samples the data signal DT1 at a falling timing of the clock signal CKQ, and thereby generates a signal D12.

Figure 17:
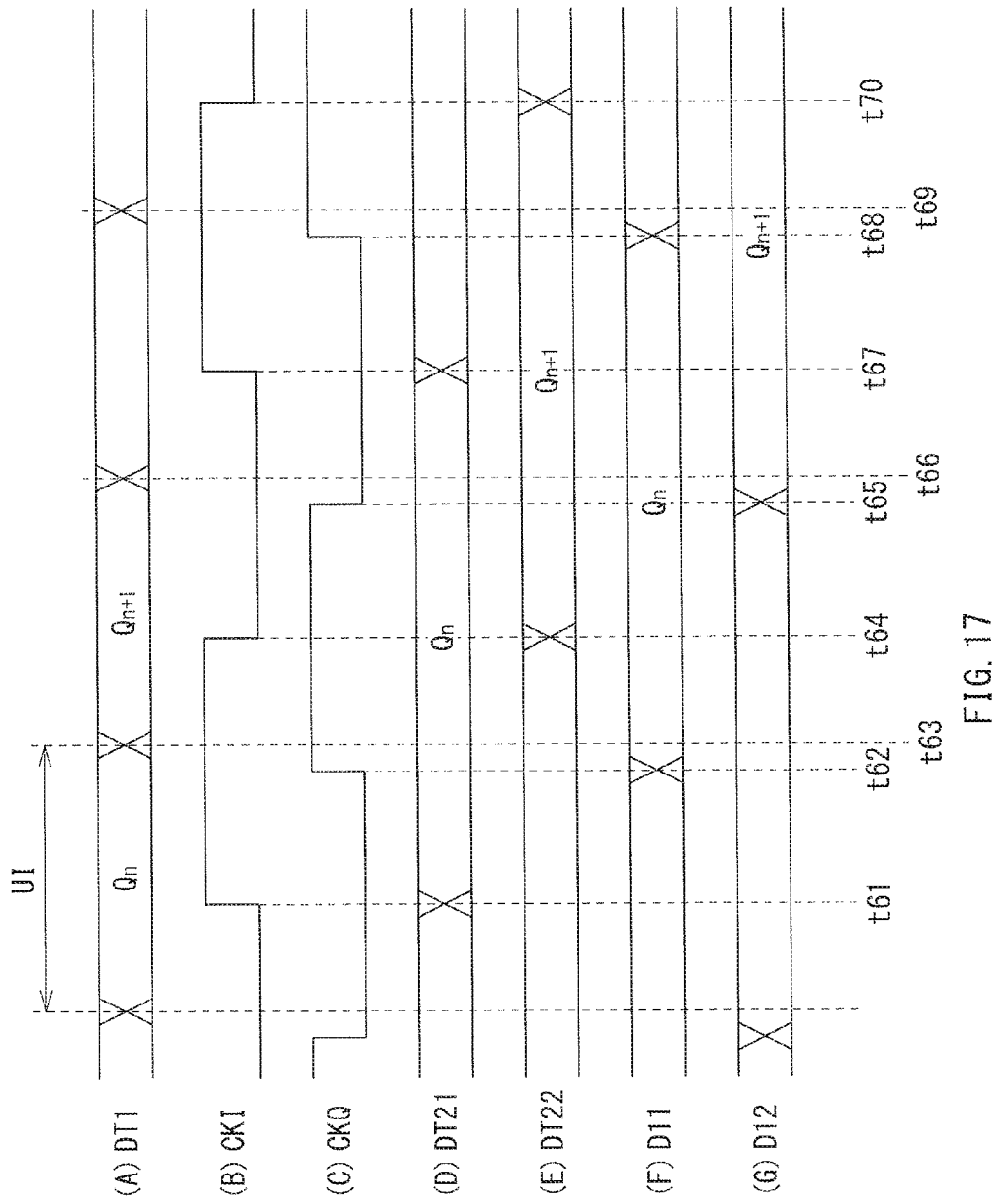
FIG. 17 is a timing waveform chart illustrating an operation example of flip-flop circuits illustrated in FIG. 16.
Figure 18:
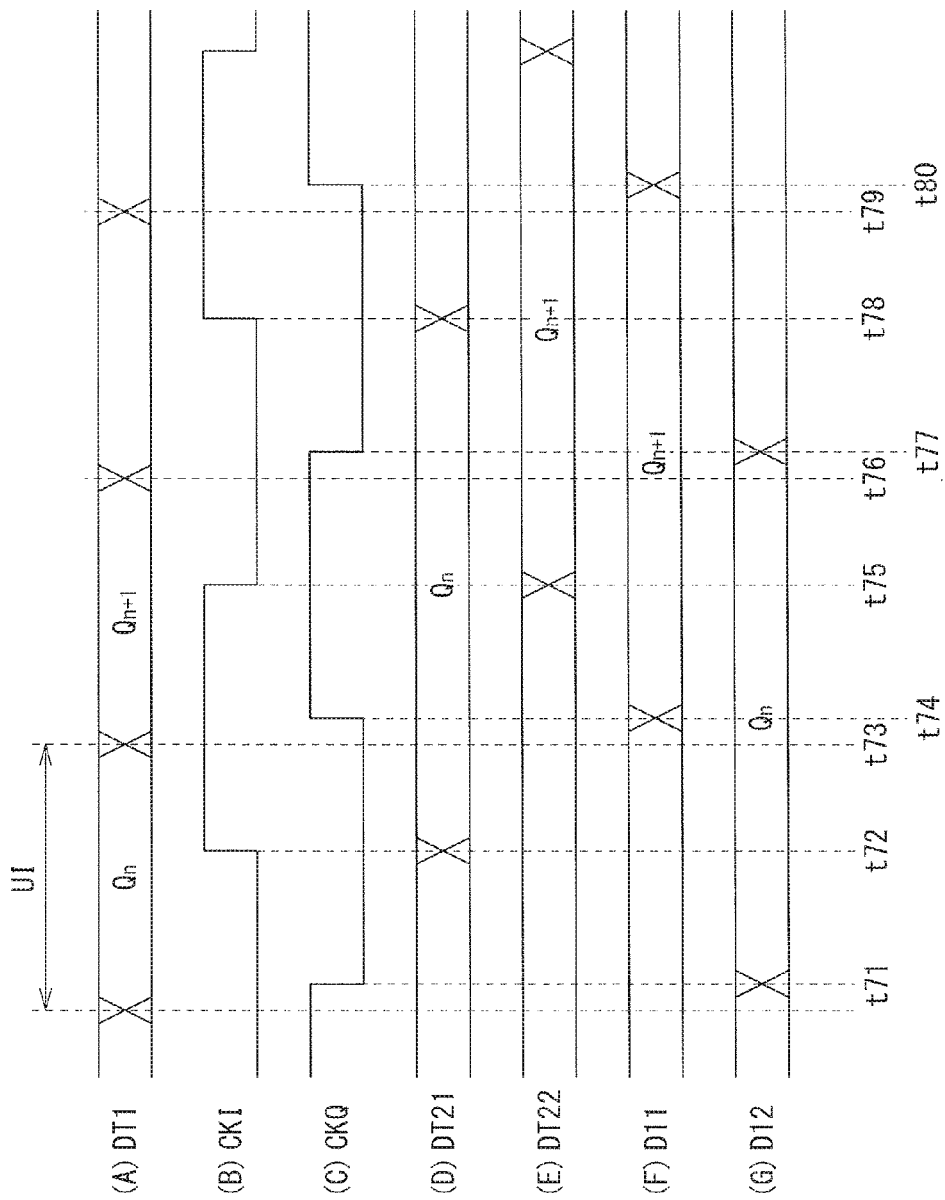
FIG. 18 is a timing waveform chart illustrating another operation example of the flip-flop circuits illustrated in FIG. 16.

FIGS. 17 and 18 each illustrate operations of the flip-flop circuits 51 to 54. FIG. 17 illustrates a case where the phases of the clock signals CKI and CKQ are advanced, and FIG. 18 illustrates a case where the phases of the clock signals CKI and CKQ are delayed. In other words, FIG. 17 corresponds to FIG. 6 in the case of the first embodiment described above, and FIG. 18 corresponds to FIG. 7 in the case of the first embodiment described above. In FIGS. 17 and 18, (A) illustrates the waveform of the data signal DT1, (B) illustrates a waveform of the clock signal CKI, (C) illustrates a waveform of the clock signal CKQ, (D) illustrates a waveform of the data signal DT21, (E) illustrates a waveform of the data signal DT22, (F) illustrates a waveform of the signal D11, and (G) illustrates a waveform of the signal D12. The flip-flop circuit 51 samples the data signal DT1 at the rising timing of the clock signal CKI, and thereby generates the data signal DT21. The flip-flop circuit 52 samples the data signal DT1 at the falling timing of the clock signal CKI, and thereby generates the data signal DT22. Accordingly, as illustrated in FIGS. 17 and 18, the data $Q_n$ appears in the data signal DT21, and the data $Q_{n+1}$ appears in the data signal DT22. The flip-flop circuit 53 samples the data signal DT1 at the rising timing of the clock signal CKQ, and thereby generates the signal D11. The flip-flop circuit 54 samples the data signal DT1 at the falling timing of the clock signal CKQ, and thereby generates the signal D12. Accordingly, as illustrated in FIGS. 17 and 18, the data $Q_n$ and the data $Q_{n+1}$ appear in the signals D11 and D12 in accordance with the advance or delay of the phases of the clock signals CKI and CKQ.

The control circuit 40G generates the control signals CTLP and CTLF based on the data signals DT21 and DT22, the signals D11 and D12, and the clock signal CKI. More specifically, the control circuit 40G makes a comparison between the data signals DT21 and DT22 and the signals D11 and D12, and thereby generates the control signals CTLP and CTLF, as with the control circuit 40 in the first embodiment described above.

[Modification 1-6]

In the first embodiment described above, the frequency of the clock signal CK is controlled based on the data signal DT. However, for example, the frequency of the clock signal CK may be controlled also based on a reference clock signal REFCK at a time of activating a power supply, or the like. A reception unit 1H according to the present modification is described below in detail.

Figure 19:
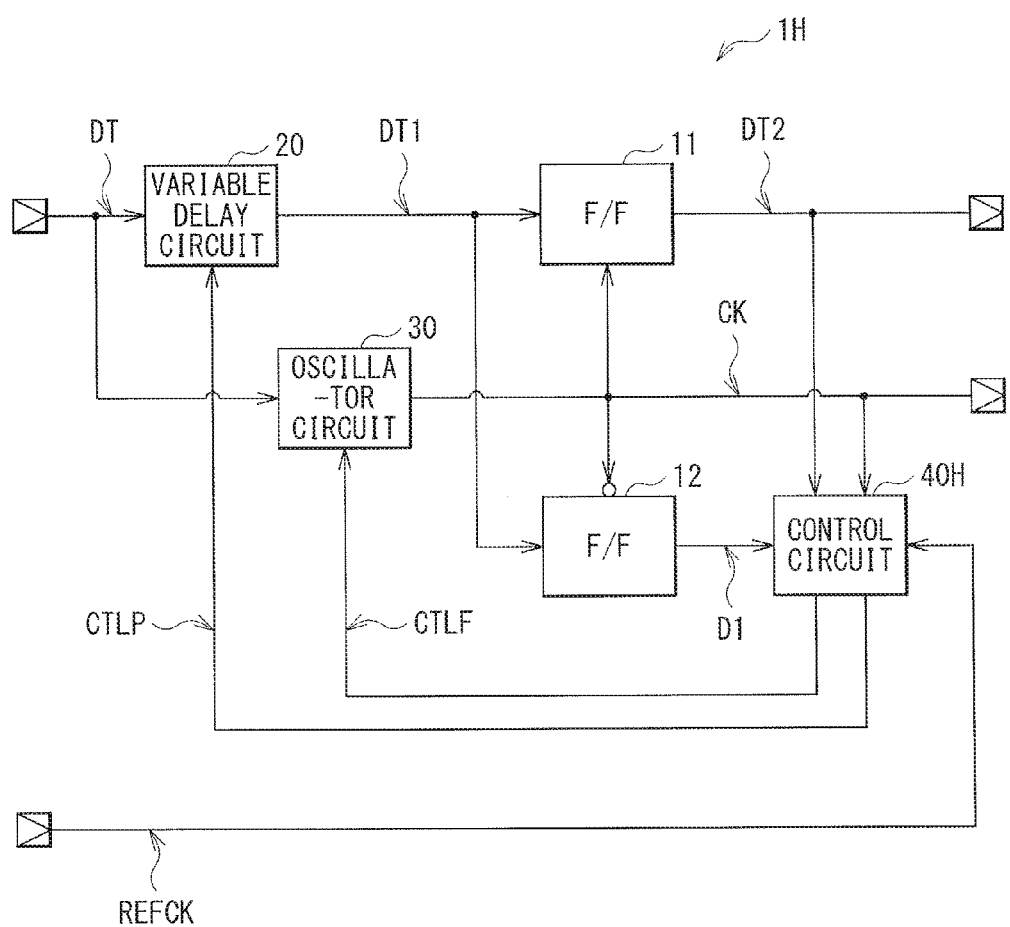
FIG. 19 is a block diagram illustrating a configuration example of a reception unit according to another modification of the first embodiment.

FIG. 19 illustrates a configuration example of the reception unit 1H according to the present modification. The reception unit 1H includes a control circuit 40H. The control circuit 40H generates the control signals CTLP and CTLF based on the data signal DT2, the signal D1, and the clock signal CK, as with the control circuit 40 according to the first embodiment described above. The control circuit 40H also has a function of generating the control signal CTLF based on the reference clock signal REFCK, for example, at the time of activating the power supply of the reception unit 1H, or the like. In this example, a value of the frequency of the reference clock signal REFCK is "1/N" of the value of the bit rate of the data signal DT.

Figure 20:
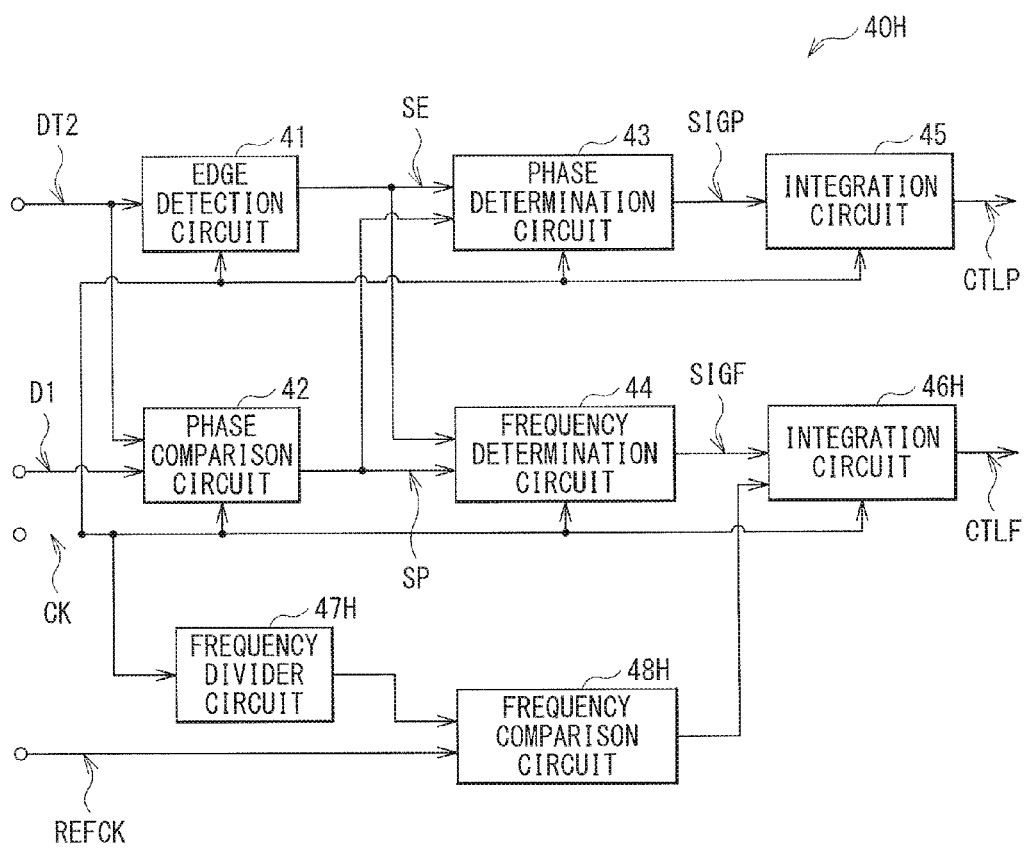
FIG. 20 is a block diagram illustrating a configuration example of a control circuit illustrated in FIG. 19.

FIG. 20 illustrates a configuration example of the control circuit 40H. The control circuit 40H includes a frequency divider circuit 47H, a frequency comparison circuit 48H, and an integration circuit 46H. The frequency divider circuit 47H divides the frequency of the clock signal CK by N, and outputs a signal having the divided frequency. The frequency comparison circuit 48H makes a comparison between the frequency of the output signal of the frequency divider circuit 47H and the frequency of the reference clock signal REFCK, for example, at the time of activating the power supply, or the like, and supplies a result of the comparison to the integration circuit 46H. In other words, the frequency divider circuit 47H is so inserted as to cause the frequencies of the two signals inputted to the frequency comparison circuit 48H to be about the same. The integration circuit 46H integrates the values of the signal SIGF, and generates the control signal CTLF based on the integrated value, as with the integration circuit 46 in the first embodiment described above. The integration circuit 46H also integrates the comparison results supplied from the frequency comparison circuit 48H, and generates the control signal CTLF based on the integrated value, for example, at the time of activating the power supply.

In the reception unit 1H, this configuration allows a negative feedback operation to be so performed that the value of the frequency of the clock signal CK becomes closer to the value of the bit rate of the data signal DT, for example, at the time of activating the power supply. Accordingly, it is possible to allow the value of the frequency of the clock signal CK to be closer to the value of the bit rate of the data signal DT before the data signal DT is supplied to the reception unit 1H, for example, at the time of activating the power supply, or the like. As a result, the reception unit 1H is allowed to start generating the desired data signal DT2 and the desired clock signal CK immediately after the data signal DT is supplied thereto.

In this example, the reference clock signal REFCK is used; however, the signal to be used is not limited thereto. Alternatively, for example, at the time of activating the power supply, or the like, the transmission unit may transmit the data signal DT having an alternating pattern, and the reception unit may control the frequency of the clock signal CK based on the transmitted data signal DT. A reception unit 1J according to the present modification is described below in detail.

Figure 21:
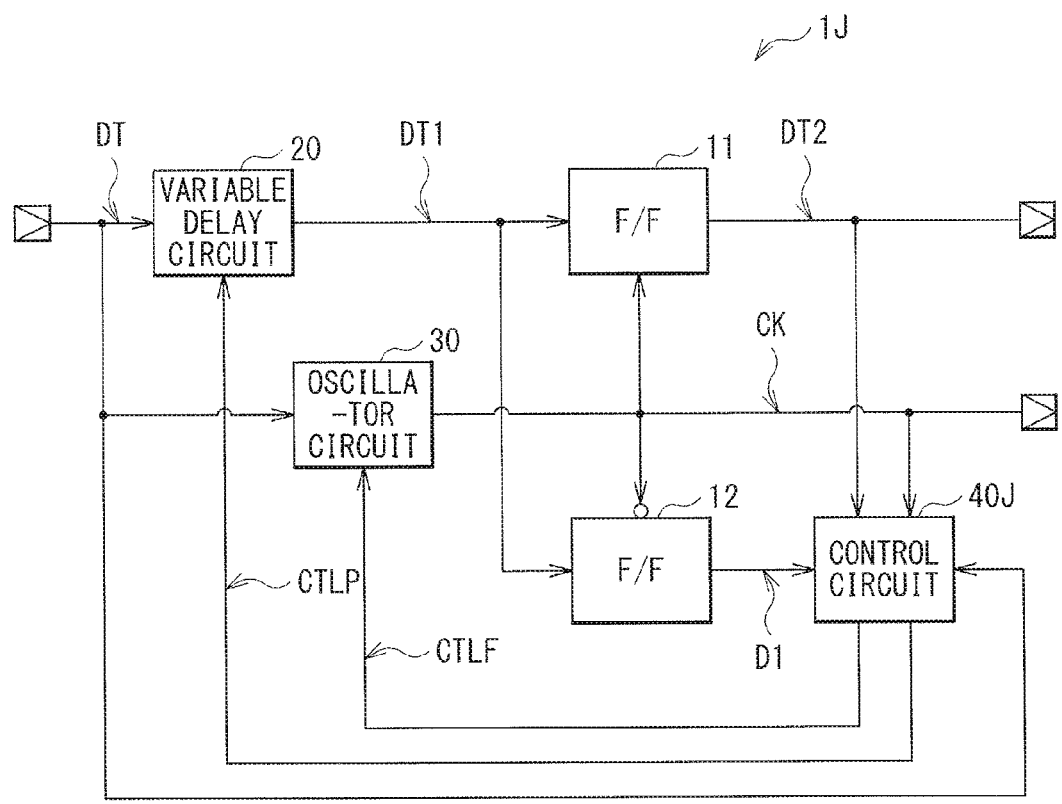
FIG. 21 is a block diagram illustrating a configuration example of a reception unit according to another modification of the first embodiment.

FIG. 21 illustrates a configuration example of the reception unit 1J according to the present modification. The reception unit 1J includes a control circuit 40J. The control circuit 40J also has a function of generating the control signal CTLF based on the data signal DT having an alternating pattern, for example, at the time of activating the power supply, or the like. In this example, the alternating pattern of the data signal DT toggles alternately on the unit-interval UI unit basis. In this case, the value of the frequency of this signal is ½ of the value of the bit rate of the supposed data signal DT. It is to be noted that the alternating pattern of the data signal DT is not limited thereto, and may toggle alternately on two-unit-interval UI unit basis, for example. In this case, the value of the frequency of the signal is ¼ of the value of the bit rate of the supposed data signal DT.

Figure 22:
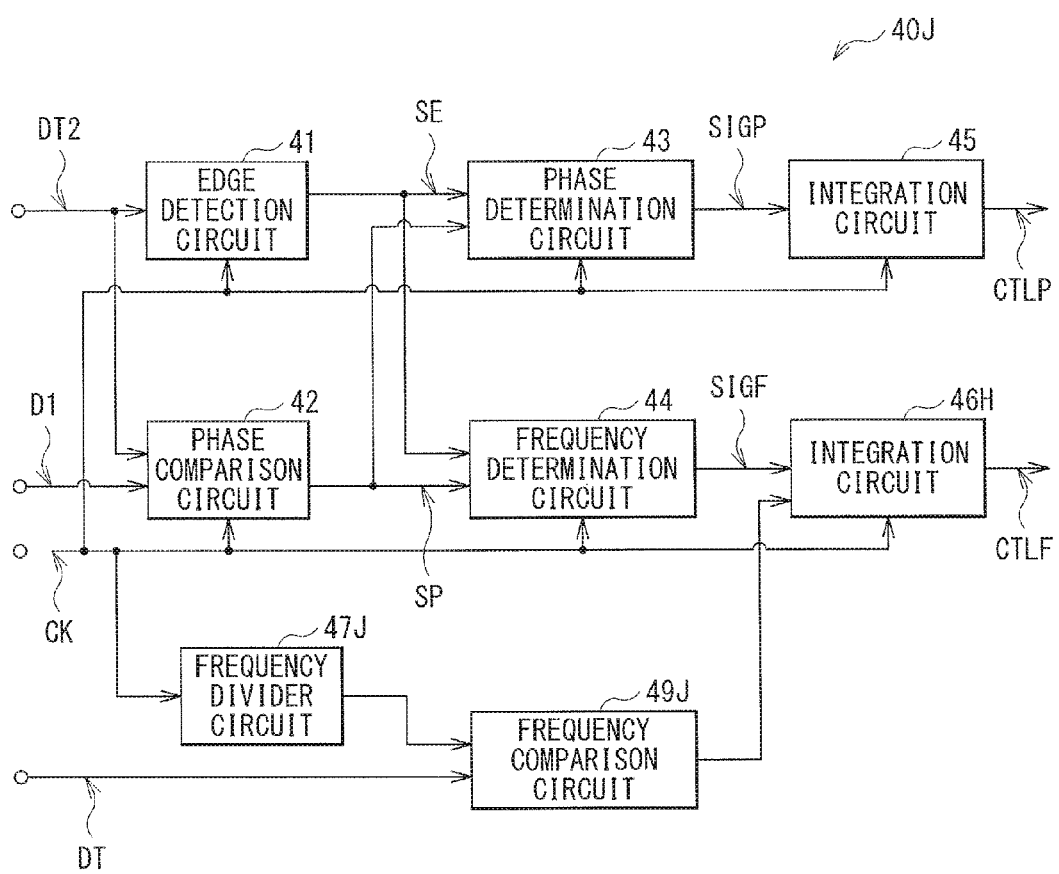
FIG. 22 is a block diagram illustrating a configuration example of a control circuit illustrated in FIG. 21.

FIG. 22 illustrates a configuration example of the control circuit 40J. The control circuit 40J includes a frequency divider circuit 47J and a frequency comparison circuit 49J. The frequency divider circuit 47J performs frequency division on the clock signal CK, and outputs a signal having the divided frequency. The frequency comparison circuit 49J makes a comparison between the frequency of the output signal of the frequency divider circuit 47J and the frequency of the data signal DT, and supplies a result of the comparison to the integration circuit 46H. In other words, the frequency divider circuit 47J is so inserted as to cause the frequencies of the two signals inputted to the frequency comparison circuit 49J to be about the same.

Also when such a configuration is employed, the value of the frequency of the clock signal CK is allowed to be closer to the value of the bit rate of the data signal DT, for example, at the time of activating the power supply.

[Other Modifications]

Moreover, two or more of the above-described modifications may be employed in combination.

2. Second Embodiment

Next, a reception unit 2 according to a second embodiment is described. The second embodiment is different from the first embodiment described above in the method of controlling the delay amount of the variable delay circuit 20 and the frequency of the clock signal CK. It is to be noted that components substantially the same as those in the reception unit 1 according to the first embodiment described above are designated with the same numerals, and description thereof is omitted where appropriate.

As illustrated in FIG. 1, the reception unit 2 reproduces the clock signal CK and the data signal DT2 from the received data signal DT, as with the reception unit 1. In this example, the data signal DT may include a signal portion that toggles consecutively, for example, as "1010", or may include almost no such signal portion. The reception unit 2 includes an oscillator circuit 60 and a control circuit 70.

As illustrated in FIG. 4, the oscillator circuit 60 includes an edge detection circuit 67. The edge detection circuit 67 detects a falling edge of the data signal DT, and thereby generates the signal E1. More specifically, the edge detection circuit 67 sets the signal E1 to the high level when the data signal DT makes no transition, and sets the signal E1 to the low level in the period PG when the data signal DT makes a transition from the high level to the low level. The period PG is a period having a length that is about half of the bit length (the unit interval UI) of the data signal DT. Due to this configuration, in the oscillator circuit 60, when the data signal DT makes a transition from the high level to the low level, the phase of the clock signal CK is varied in response to the transition of the data signal DT. In other words, unlike the oscillator circuit 30 according to the first embodiment, the oscillator circuit 60 corrects the phase of the clock signal CK only with use of the falling transition of the data signal DT.

Figure 23:
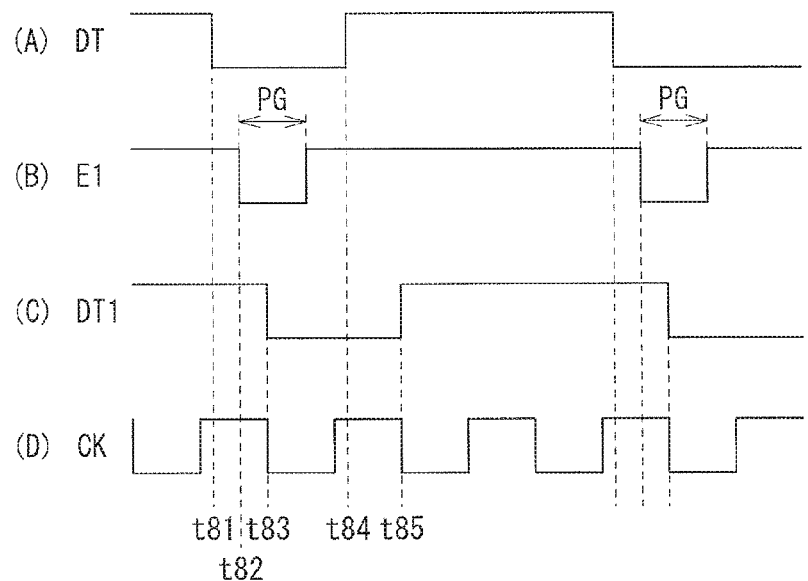
FIG. 23 is a timing waveform chart illustrating an operation example of a variable delay circuit and an oscillator circuit according to a second embodiment.

FIG. 23 illustrates an operation example of the variable delay circuit 20 and the oscillator circuit 60. In this example, first, the edge detection circuit 67 in the oscillator circuit 60 detects a falling edge of the data signal DT at a timing t81, and sets the signal E1 to the low level in a period PG starting from a timing t82 that is a timing that is later than the timing t81 by a circuit delay ((B) of FIG. 23). In response to varying of the signal E1 to the low level at the timing t82, the oscillator circuit 60 sets the clock signal CK to the low level in a predetermined period starting from a timing t83 that is a timing that is later than the timing t82 by a circuit delay. Also, the variable delay circuit 20 delays the data signal DT that falls at the timing t81 and rises at the timing t84, and thereby generates the data signal DT1 that falls at the timing t83 and rises at a timing t85. In the reception unit 2, the delay amount of the variable delay circuit 20 is so controlled that the falling timing of the clock signal CK coincides with the transition timing of the data signal DT1, as in the reception unit 1 according to the first embodiment.

Figure 24:
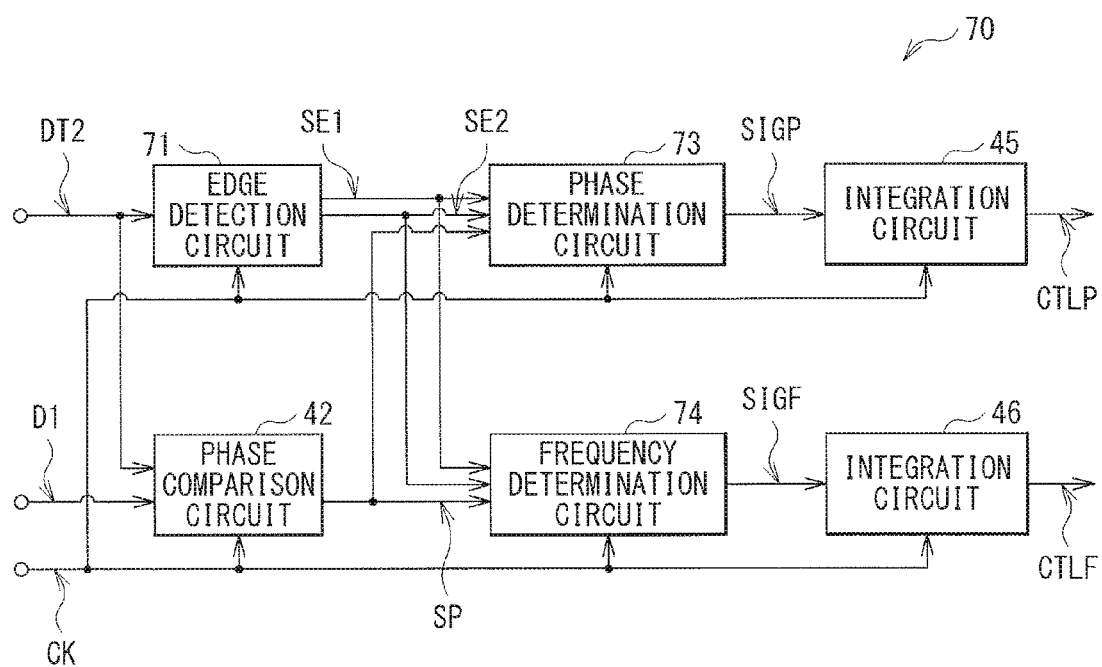
FIG. 24 is a block diagram illustrating a configuration example of a control circuit according to the second embodiment.

FIG. 24 illustrates a configuration example of the control circuit 70. The control circuit 70 includes an edge detection circuit 71, a phase determination circuit 73, and a frequency determination circuit 74.

The edge detection circuit 71 generates, based on the data signal DT2 and the clock signal CK, a rising edge detection signal SE1 that becomes enable when the rising edge of the data signal DT2 is detected. The edge detection circuit 71 also generates, based on the data signal DT2 and the clock signal CK, a falling edge detection signal SE2 that becomes enable when the falling edge of the data signal DT2 is detected.

The phase determination circuit 73 generates the signal SIGP based on the rising edge detection signal SE1, the falling edge detection signal SE2, the phase comparison signal SP, and the clock signal CK. The frequency determination circuit 74 generates the signal SIGF based on the rising edge detection signal SE1, the falling edge detection signal SE2, the phase comparison signal SP, and the clock signal CK.

Figure 25:
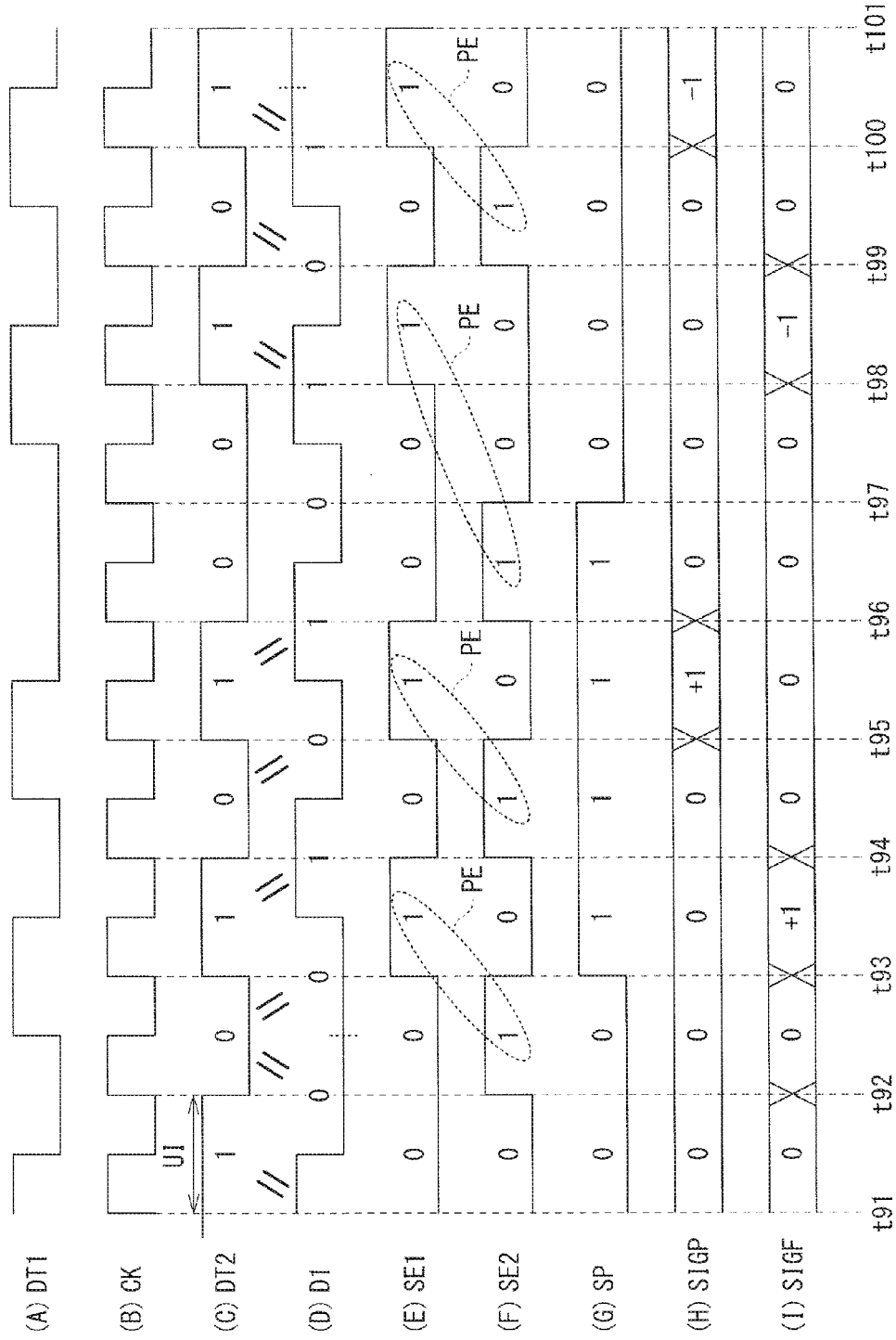
FIG. 25 is a timing waveform chart illustrating an operation example of a reception unit according to the second embodiment.

FIG. 25 illustrates an operation example of the reception unit 2, in which (A) illustrates the waveform of the data signal DT1, (B) illustrates the waveform of the clock signal CK, (C) illustrates the waveform of the data signal DT2, (D) illustrates the waveform of the signal D1, (E) illustrates a waveform of the rising edge detection signal SE1, (F) illustrates a waveform of the falling edge detection signal SE2, (G) illustrates the waveform of the phase comparison signal SP, (H) illustrates the signal SIGP, and (I) illustrates the signal SIGF. It is to be noted that the waveforms illustrated in (A) to (D) of FIG. 25 are the same as the waveforms illustrated in (A) to (D) in FIG. 9 according to the first embodiment.

The edge detection circuit 71 in the control circuit 70 detects the rising edge of the data signal DT2, and thereby generates the rising edge detection signal SE1 ((E) of FIG. 25), as well as detects the falling edge of the data signal DT2, and thereby generates the falling edge detection signal SE2. More specifically, for example, because the data signal DT2 makes a transition from the high level to the low level at a timing t92, the edge detection circuit 71 sets the falling edge detection signal SE2 to the high level (to be enable) in a period from the timing t92 to a timing t93. Also, for example, because the data signal DT2 makes a transition from the low level to the high level at the timing t93, the edge detection circuit 71 sets the rising edge detection signal SE1 to the high level (to be enable) in a period from the timing t93 to a timing t94. The same applies to the subsequent periods.

The phase determination circuit 73 generates the signal SIGP based on the rising edge detection signal SE1, the falling edge detection signal SE2, and the phase comparison signal SP ((H) of FIG. 25). More specifically, the phase determination circuit 73 first detects a pair PE including a falling edge of the data signal DT2 and a rising edge of the data signal DT2 immediately after that falling edge, based on the rising edge detection signal SE1 and the falling edge detection signal SE2 ((E) and (F) of FIG. 25). Further, in a case where the phase comparison signal SP at the time when the falling detection signal SE2 is "1" is the same as the phase comparison signal SP at the time when the rising detection signal SE1 is "1" in the detected pair PE, the phase determination circuit 73 generates the signal SIGP at a time when the rising detection signal SE1 is "1", based on the phase comparison signal SP. In other words, the phase determination circuit 73 sets the signal SIGP to "+1" when the phase comparison signal SP is "1", and sets the signal SIGP to "−1" when the phase comparison signal SP is "0". In other cases, the phase determination circuit 73 sets the signal SIGP to "0".

In this example, the falling edge detection signal SE2 is "1" in a period from the timing t92 to the timing t93, and the rising edge detection signal SE1 is "1" in the subsequent period from the timing t93 to the timing t94. Accordingly, the phase determination circuit 73 detects the pair PE in a period from the timing t92 to the timing t94. In the detected pair PE, because the phase comparison signal SP in the period from the timing t92 to the timing t93 is "0", and the phase comparison signal SP in the period from the timing t93 to the timing t94 is "1", these phase comparison signals SP in the respective periods are different from each other. Accordingly, the phase determination circuit 73 sets the signal SIGP in the period from the timing t93 to the timing t94 to "0".

The falling edge detection signal SE2 in a period from the timing t94 to a timing t95 is "1", and the rising edge detection signal SE1 in a subsequent period from the timing t95 to a timing t96 is "1". Accordingly, the phase determination circuit 73 detects the pair PE in a period from the timing t94 to the timing t96. In the detected pair PE, both of the phase comparison signals SP in the period from the timing t94 to the timing t95 and in the period from the timing t95 to the timing t96 are "1". Accordingly, the phase determination circuit 73 sets the signal SIGP in the period from the timing t95 to the timing t96 to "+1".

The falling edge detection signal SE2 in a period from the timing t96 to a timing t97 is "1", and the rising edge detection signal SE1 in a period from a timing t98 to a timing t99 is "1". Accordingly, the phase determination circuit 73 detects the pair PE in a period from the timing t96 to the timing t99. In the detected pair PE, because the phase comparison signal SP in the period from the timing t96 to the timing t97 is "1" and the phase comparison signal SP in the period from the timing t98 to the timing t99 is "0", these phase comparison signals SP in the respective periods are different from each other. Accordingly, the phase determination circuit 73 sets the signal SIGP in the period from the timing t98 to the timing t99 to "0".

The falling edge detection signal SE2 in a period from the timing t99 to a timing t100 is "1", and the rising edge detection signal SE1 in a subsequent period from the timing t100 to a timing t101 is "1". Accordingly, the phase determination circuit 73 detects the pair PE in a period from the timing t99 to the timing t101. In the detected pair PE, both of the phase comparison signals SP in the period from the timing t99 to the timing t100 and in the period from the timing t100 to the timing t101 are "0". Accordingly, the phase determination circuit 73 sets the signal SIGP in the period from the timing t100 to the timing t101 to "−1".

The integration circuit 45 integrates the signal SIGP, and thereby generates the control signal CTLP. Further, the variable delay circuit 20 varies the delay amount based on the generated control signal CTLP.

The frequency determination circuit 74 generates the signal SIGF based on the rising edge detection signal SE1, the falling edge detection signal SE2, and the phase comparison signal SP ((I) of FIG. 25). More specifically, the frequency determination circuit 74 first detects the pair PE, as with the phase determination circuit 73 ((E) and (F) of FIG. 25). Further, in a case where the phase comparison signal SP at the time when the falling detection signal SE2 is "1" is different from the phase comparison signal SP at the time when the rising detection signal SE1 is "1" in the detected pair PE, the frequency determination circuit 74 generates the signal SIGP, based on the phase comparison signal SP at the time when the rising detection signal SE1 is "1". In other words, the frequency determination circuit 74 sets the signal SIGF to "+1" when the phase comparison signal SP is "1", and sets the signal SIGF to "−1" when the phase comparison signal SP is "0". In other cases, the frequency determination circuit 74 sets the signal SIGF to "0".

For example, because the phase comparison signal SP ("0") in the period from the timing t92 to the timing t93 is different from the phase comparison signal SP ("1") in the period from the timing t93 to the timing t94 in the pair PE in the period from the timing t92 to the timing t94, the frequency determination circuit 74 sets the signal SIGF in the period from the timing t93 to the timing t94 to "+1" based on the phase comparison signal SP ("1") in the period from the timing t93 to the timing t94.

Because both of the phase comparison signals SP in the period from the timing t94 to the timing t95 and in the period from the timing t95 to the timing t96 are "1" in the pair PE in the period from the timing t94 to the timing t96, the frequency determination circuit 74 sets the signal SIGF in the period from the timing t95 to the timing t96 to "0".

Because the phase comparison signal SP ("1") in the period from the timing t96 to the timing t97 is different from the phase comparison signal SP ("0") in the period from the timing t98 to the timing t99 in the pair PE in the period from the timing t96 to the timing t99, the frequency determination circuit 74 sets the signal SIGF in the period from the timing t98 to the timing t99 to "−1" based on the phase comparison signal SP ("0") in the period from the timing t98 to the timing t99.

Because both of the phase comparison signals SP in the period from the timing t99 to the timing t100 and in the period from the timing t100 to the timing t101 are "0" in the pair PE in a period from the timing t99 to the timing t101, the frequency determination circuit 74 sets the signal SIGF in the period from the timing t100 to the timing t101 to "0".

The integration circuit 46 integrates the signal SIGF, and thereby generates the control signal CTLF. Further, the oscillator circuit 60 varies the frequency of the clock signal CK based on the generated control signal CTLF.

In such a manner, in the reception unit 2, the pair PE including the falling edge of the data signal DT2 and the rising edge of the data signal DT2 immediately after that falling edge is detected, and the signals SIGP and SIGF are generated based on the phase comparison signals SP in the detected pair PE. As a result, the reception unit 2 is usable for various applications. Specifically, for example, because the reception unit 1 according to the first embodiment operates utilizing the signal portion that toggles consecutively as "1010" included in the data signal DT, it may be more difficult to perform a desired operation in a case where the data signal DT that includes almost no such signal portion, for example, a non-scrambled signal, is supplied. On the other hand, the reception unit 2 according to the second embodiment operates without utilizing the signal portion that consecutively toggles. Accordingly, it is possible to reduce a constraint with respect to the data signal DT, and to therefore allow reception of the data signal DT in various formats.

Moreover, in the reception unit 2, in the case where the phase comparison signals SP in the pair PE are different from each other, the signal SIGF is generated based on the phase comparison signal SP. As a result, it is possible to effectively control the frequency of the clock signal CK. In other words, the oscillator circuit 60 corrects the phase of the clock signal CK with use of the falling transition of the data signal DT. Accordingly, the oscillator circuit 60 does not correct the phase of the clock signal CK and generates the clock signal CK having a frequency in accordance with the control signal CTLF, in a period from the falling transition of the data signal DT2 to the next falling transition thereof. Specifically, the phase comparison signal SP at a time when the data signal DT2 falls is the phase comparison signal SP that is immediately after the phase of the clock signal CK is corrected, and the phase comparison signal SP at a time when the data signal DT2 rises after that falling of the data signal DT2 is the phase comparison signal Sp at a time after time has passed after this correction of the phase of the clock signal CK. Accordingly, when the two phase comparison signals SP are different from each other, it may be highly possible that the value of the frequency of the clock signal CK be different from the value of the bit rate of the data signal DT. In the reception unit 2, in the case where the phase comparison signals SP in the pair PE are different from each other, the signal SIGF is generated based on the phase comparison signal SP. As a result, in the reception unit 2, it is possible to effectively control the frequency of the clock signal CK.

Moreover, in the reception unit 2, in the case where the phase comparison signals SP in the pair PE are the same as each other, the signal SIGP is generated based on the phase comparison signal SP. As a result, it is possible to effectively control the delay amount of the variable delay circuit 20. Specifically, in the reception unit 2, the phase comparison signal SP at the time when the data signal DT2 falls is the phase comparison signal SP that is immediately after the phase of the clock signal CK is corrected, and the phase comparison signal SP at the time when the data signal DT2 rises after that falling of the data signal DT2 is the phase comparison signal SP at a time after time has passed after this correction of the phase of the clock signal CK. Accordingly, when the two phase comparison signals SP are the same, it may be highly possible that the delay amount of the variable delay circuit 20 be different from the desired delay amount thereof. In the reception unit 2, in the case where the phase comparison signals SP in the pair PE are the same, the signal SIGP is generated based on the phase comparison signal SP. As a result, in the reception unit 2, it is possible to effectively control the delay amount of the variable delay circuit 20.

As described above, in the second embodiment, the pair including the falling edge of the data signal and the rising edge of the data signal immediately after the falling edge is detected, and the signals SIGP and SIGF are generated based on the phase comparison signals in the detected pair. As a result, it is possible to receive a data signal in various formats.

Moreover, in the second embodiment, in the case where the phase comparison signals in the pair are different from each other, the signal SIGF is generated based on the phase comparison signal. This makes it possible to effectively control the frequency of the clock signal. As a result, it is possible to improve the communication quality.

Moreover, in the second embodiment, in the case where the phase comparison signals in the pair are the same, the signal SIGP is generated based on the phase comparison signal. This makes it possible to effectively control the delay amount of the variable delay circuit. As a result, it is possible to improve the communication quality.

[Modification 2-1]

Figure 26:
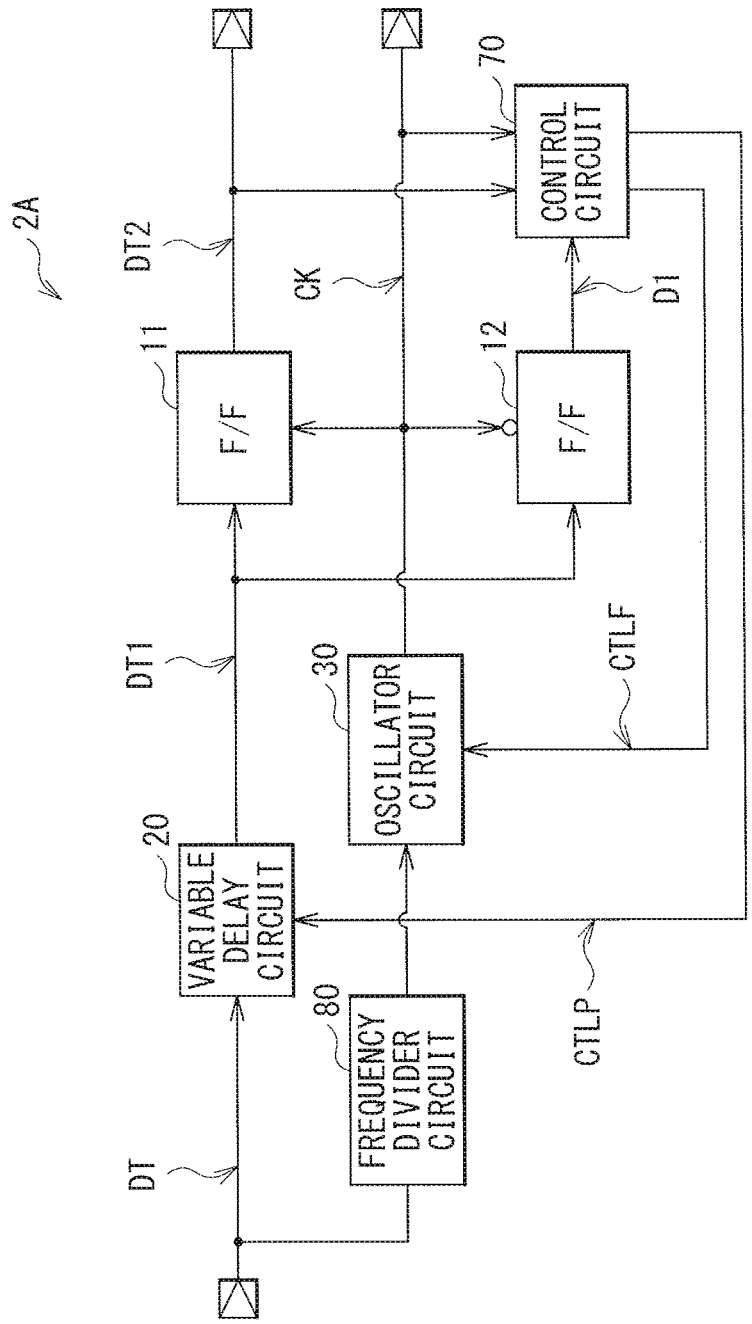
FIG. 26 is a block diagram illustrating a configuration example of a reception unit according to another modification of the second embodiment.

In the second embodiment described above, the oscillator circuit 60 generates the clock signal CK; however, the configuration to be employed is not limited thereto. Alternatively, for example, as in a reception unit 2A illustrated in FIG. 26, a frequency divider circuit 80 that performs a frequency division operation with use of the falling edge of the data signal DT, and the oscillator circuit 30 that operates based on an output signal of the frequency divider circuit 80 may be provided to generate the clock signal CK. The number by which the frequency is divided by the frequency divider circuit 80 may be two or greater, for example.

[Modification 2-2]

In the second embodiment described above, the edge detection circuit 67 in the oscillator circuit 60 detects the falling edge of the data signal DT; however, the configuration to be employed is not limited thereto. Alternatively, for example, the rising edge of the data signal DT may be detected. In this case, the phase determination circuit 73 and the frequency determination circuit 74 detect the rising edge of the data signal DT2 and the falling edge of the data signal DT2 immediately after that rising edge as the pair PE. It is possible to achieve effects similar to those in the second embodiment described above also in this case.

The present technology has been described above referring to some embodiments and the modifications thereof; however, the present technology is not limited to the embodiments and the like described above, and may be variously modified.

For example, the oscillator of a so-called gated VCO type is used in the respective embodiments and the like described above; however, the oscillator to be used is not limited thereto. Alternatively, for example, an oscillator of an injection locked type may be used.

Figure 27:
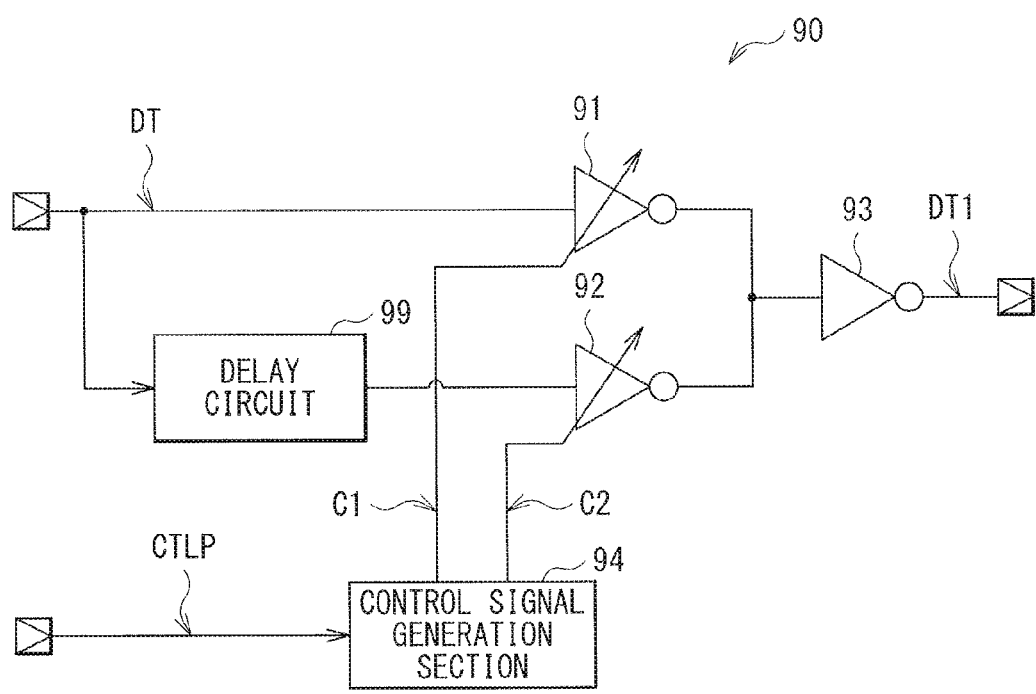
FIG. 27 is a block diagram illustrating a configuration example of a variable delay circuit according to another modification.

Moreover, for example, in the respective embodiments and the like described above, the configuration of the variable delay circuit 20 is not limited to the configuration illustrated in FIG. 2. For example, a configuration illustrated in FIG. 27 may be employed. A variable delay circuit 90 includes a delay circuit 99, inverters 91 and 92, an inverter 93, and a control signal generation section 94. The delay circuit 99 delays the data signal DT by a predetermined delay amount and outputs the delayed data signal. The predetermined delay amount may have, for example, a length about half of the bit length (the unit interval UI) of the data signal DT. The inverter 91 inverts the data signal DT, and outputs the inverted data signal. Drive power of the inverter 91 is allowed to be adjusted in accordance with a control signal C1. More specifically, the inverter 91 may be allowed to vary the number of transistors to be used, current values, etc. in accordance with the control signal C1, for example. The inverter 92 inverts an output signal of the delay circuit 99 and outputs the inverted signal. Drive power of the inverter 92 is allowed to be adjusted in accordance with the control signal C2. Output terminals of the inverters 91 and 92 are connected to each other, and are led to an input terminal of the inverter 93. The inverter 93 inverts the supplied signal, and outputs the inverted signal as the data signal DT1. The control signal generation section 94 generates the control signals C1 and C2 based on the control signal CTLP. Due to this configuration, in the variable delay circuit 90, the data signal DT and the data signal outputted from the delay circuit 99 are weighted by the inverters 91 and 92, respectively, and the weighted signals are added up. Accordingly, for example, when the drive power of the inverter 91 is enhanced, the phase of the data signal DT1 is advanced, and when the drive power of the inverter 92 is enhanced, the phase of the data signal DT1 is delayed.

Figure 28:
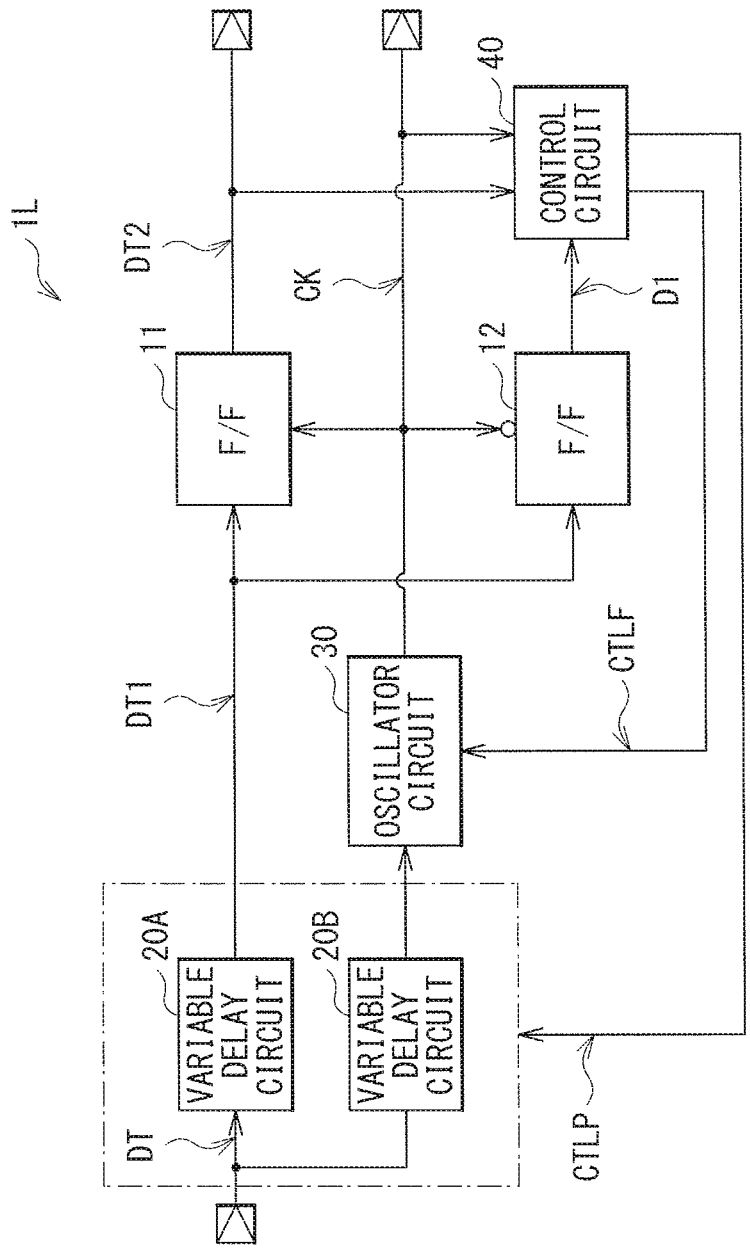
FIG. 28 is a block diagram illustrating a configuration example of a reception unit according to another modification.
Figure 29:
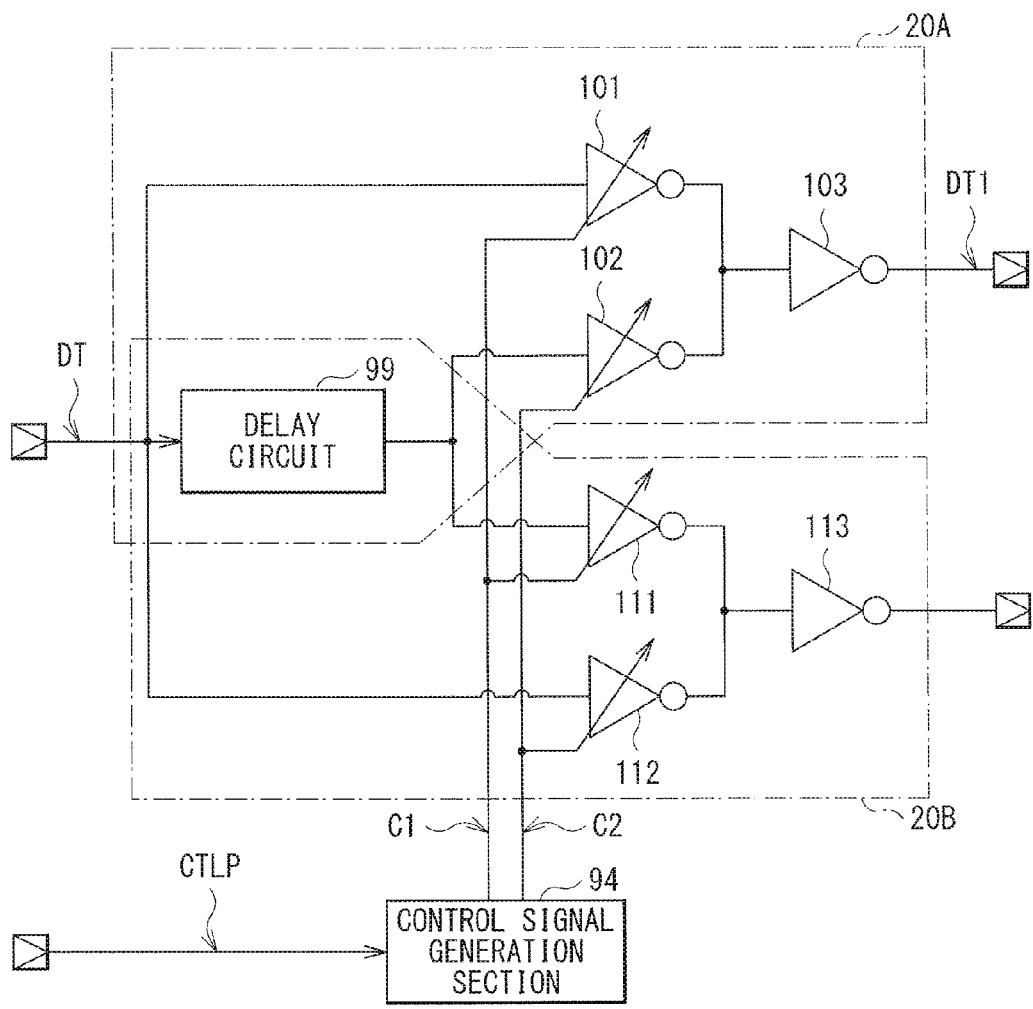
FIG. 29 is a block diagram illustrating a configuration example of a variable delay circuit illustrated in FIG. 28.

Next, with use of this technology, description is provided of a case in which the variable delay circuits 20A and 20B in the reception unit 1F1 illustrated in FIG. 15A are configured. FIG. 28 illustrates a configuration example of a reception unit 1L according to the present modification. The reception unit 1L includes the variable delay circuits 20A and 20B, and the control circuit 40. The control circuit 40 supplies the control signal CTLP to the variable delay circuits 20A and 20B. FIG. 29 illustrates a configuration example of the variable delay circuits 20A and 20B according to the present modification. An inverter 101 inverts the data signal DT, and outputs the inverted data signal. Drive power of the inverter 101 is allowed to be adjusted in accordance with the control signal C1. The inverter 102 inverts the output signal of the delay circuit 99, and outputs the inverted signal. Drive power of the inverter 102 is allowed to be adjusted in accordance with the control signal C2. Output terminals of the inverters 101 and 102 are connected to each other, and are led to an input terminal of an inverter 103. An inverter 111 inverts the output signal of the delay circuit 99, and outputs the inverted signal. Drive power of the inverter 111 is allowed to be adjusted in accordance with the control signal C1. An inverter 112 inverts the data signal DT, and outputs the inverted data signal. Drive power of the inverter 112 is allowed to be adjusted in accordance with the control signal C2. Output terminals of the inverters 111 and 112 are connected to each other, and are led to an input terminal of an inverter 113. A circuit block including the delay circuit 99, the inverters 101 and 102, and the inverter 103 corresponds to the variable delay circuit 20A, and a circuit block including the delay circuit 99, the inverters 111 and 112, and the inverter 113 corresponds to the variable delay circuit 20B. In this configuration, for example, when the drive power of the inverters 101 and 111 is enhanced, the phase of the output signal (the data signal DT1) of the variable delay circuit 20A is advanced, and the phase of the output signal of the variable delay circuit 20B is delayed. For example, when the drive power of the inverters 102 and 112 is enhanced, the phase of the output signal (the data signal DT1) of the variable delay circuit 20A is delayed, and the phase of the output signal of the variable delay circuit 20B is advanced.

Figure 30:
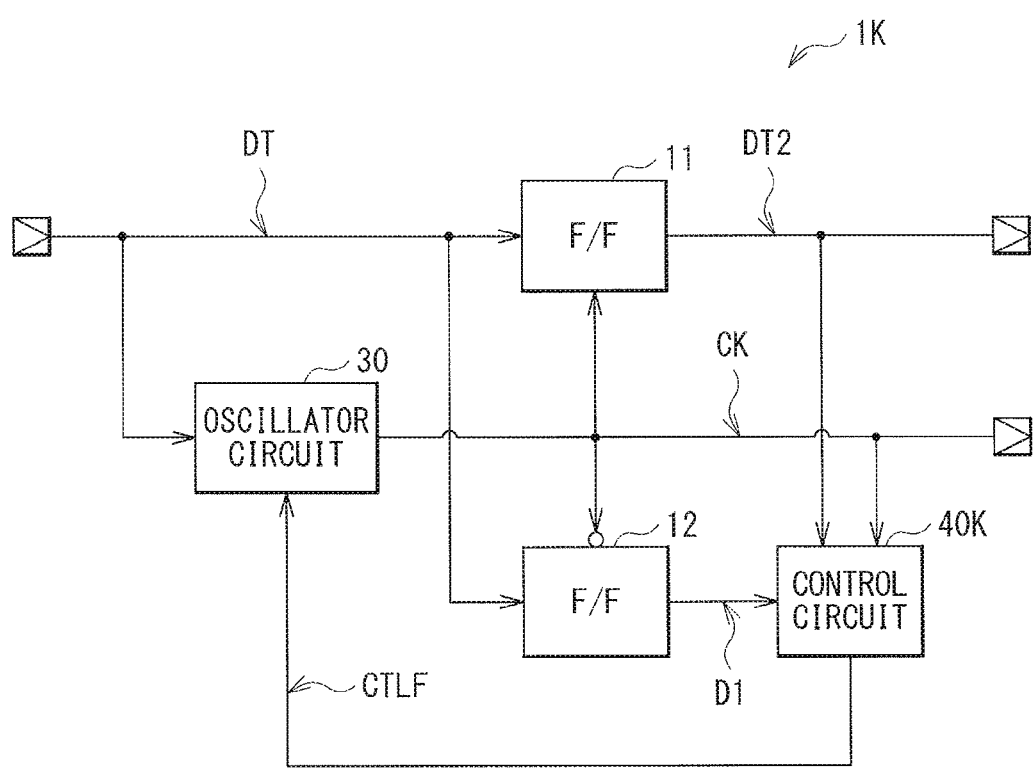
FIG. 30 is a block diagram illustrating a configuration example of a reception unit according to another modification.

Moreover, for example, in the respective embodiments and the like described above, the variable circuit 20 is provided; however, the configuration to be employed is not limited thereto. Alternatively, for example, as in a reception unit 1K illustrated in FIG. 30, the variable delay circuit may be omitted. The reception unit 1K includes a control circuit 40K. The control circuit 40K generates the control signal CTLF based on the data signal DT2, the signal D1, and the clock signal CK.

It is to be noted that the effects described herein are mere examples. The effects of the present technology are not limited thereto, and may include other effects.

It is possible to achieve at least the following configurations from the above-described example embodiments and the modifications of the disclosure.

(1) A reception unit, including:
a transition detection section configured to detect a transition of an input data signal;
an oscillation section configured to generate a clock signal and vary a phase of the clock signal based on a result of detection made by the transition detection section, the clock signal having a frequency in accordance with a first control signal;
a first sampling section configured to sample the input data signal based on the clock signal and thereby generate an output data signal; and
a control section configured to generate the first control signal based on the input data signal, the output data signal, and the clock signal.

(2) The reception unit according to (1), wherein
the control section includes
a second sampling section configured to sample the input data signal based on the clock signal at a timing different from a timing at which the first sampling section samples the input data signal, and thereby generate a sampling signal, and
a signal generation section configured to generate the first control signal based on the output data signal and the sampling signal.

(3) The reception unit according to (2), further including
a timing adjustment section configured to adjust, in accordance with a second control signal, a sampling timing in the second sampling section, wherein
the signal generation section also generates the second control signal.

(4) The reception unit according to (3), wherein
the timing adjustment section includes a delay section configured to delay the input data signal by a delay amount in accordance with the second control signal, and
the second sampling section samples the input data signal delayed by the delay section, and thereby generates the sampling signal.

(5) The reception unit according to (4), wherein the first sampling section samples the input data signal delayed by the delay section, and thereby generates the output data signal.

(6) The reception unit according to (3), wherein
the timing adjustment section includes a delay section configured to delay the input data signal by a delay amount in accordance with the second control signal, and
the transition detection section detects a transition of the input data signal delayed by the delay section.

(7) The reception unit according to (3), wherein
the timing adjustment section includes a delay section configured to delay the clock signal by a delay amount in accordance with the second control signal, and
the second sampling section samples the input data signal based on the clock signal delayed by the delay section, and thereby generates the sampling signal.

(8) The reception unit according to any one of (3) to (7), wherein the signal generation section makes a comparison between the output data signal and the sampling signal, and generates the second control signal based on a first comparison result out of results of the comparison, the first comparison result being a result obtained when the output data signal has consecutively made transitions for predetermined number of times or more.

(9) The reception unit according to (8), wherein the signal generation section generates the first control signal based on a comparison result, out of the results of the comparison, other than the first comparison result.

(10) The reception unit according to (8), wherein the signal generation section generates the first control signal based on the results of the comparison.

(11) The reception unit according to any one of (3) to (7), wherein the signal generation section makes a comparison between the output data signal and the sampling signal, and generates the first control signal based on a second comparison result out of results of the comparison, the second comparison result being a result obtained when the output data signal makes a first transition after a digit of the output data signal has become identical consecutively for predetermined number of times or more.

(12) The reception unit according to (11), wherein the signal generation section generates the second control signal based on a comparison result, out of the results of the comparison, other than the second comparison result.

(13) The reception unit according to (11), wherein the signal generation section generates the second control signal based on the results of the comparison.

(14) The reception unit according to any one of (8) to (13), wherein the transition detection section detects a transition, of the input data signal, made in a first direction and a transition, of the input data signal, made in a second direction.

(15) The reception unit according to any one of (3) to (7), wherein
the transition detection section detects a transition, of the input data signal, made in a first direction, and
the signal generation section makes a comparison between the output data signal and the sampling signal, and generates the first control signal and the second control signal based on a first comparison result and a second comparison result out of results of the comparison, the first comparison result being a result obtained when the output data signal makes a transition in the first direction, and the second comparison result being a result obtained when the output data signal makes a first transition in a second direction after the output data signal has made the transition in the first direction.

(16) The reception unit according to (15), wherein the transition detection section performs frequency division on the input data signal based on the transition, of the input data signal, in the first direction, and detects a transition of the input data signal subjected to the frequency division.

(17) The reception unit according to (15) or (16), wherein the signal generation section generates the first control signal based on the results of the comparison when the first comparison result is different from the second comparison result.

(18) The reception unit according to (15) or (16), wherein the signal generation section generates the second control signal based on the results of the comparison when the first comparison result is same as the second comparison result.

(19) The reception unit according to any one of (2) to (18), wherein
the first sampling section samples the input data signal at a timing at which the clock signal makes a transition in a first direction, and
the second sampling section samples the input data signal at a timing at which the clock signal makes a transition in a second direction.

(20) The reception unit according to any one of (2) to (18), wherein
the clock signal includes a plurality of clock signals that have phases different from one another, and the first sampling section and the second sampling section sample the input data signal based on the plurality of clock signals.

(21) The reception unit according to any one of (1) to (20), wherein the control section generates the first control signal based on the clock signal and a reference clock signal in a predetermined period.

(22) The reception unit according to any one of (1) to (20), wherein the control section generates the first control signal based on the clock signal and the input data signal in a predetermined period.

(23) The reception unit according to (21) or (22), wherein the predetermined period is a period after activating a system.

(24) A receiving method, including:
detecting a transition of an input data signal;
generating a clock signal and varying a phase of the clock signal based on the transition of the input data signal, the clock signal having a frequency in accordance with a first control signal;
sampling the input data signal based on the clock signal, and thereby generating an output data signal; and
generating the first control signal based on the input data signal, the output data signal, and the clock signal.

It should be understood by those skilled in the art that various modifications, combinations, sub-combinations, and alterations may occur depending on design requirements and other factors insofar as they are within the scope of the appended claims or the equivalents thereof.

What is claimed is:

1. A reception unit, comprising:
a transition detection section configured to detect a transition of an input data signal;
an oscillation section configured to generate a clock signal and vary a phase of the clock signal based on a result of detection made by the transition detection section, the clock signal having a frequency in accordance with a first control signal;
a first sampling section configured to sample the input data signal based on the clock signal and thereby generate an output data signal; and
a control section configured to generate the first control signal based on the input data signal, the output data signal, and the clock signal.

2. The reception unit according to claim 1, wherein the control section includes
a second sampling section configured to sample the input data signal based on the clock signal at a timing different from a timing at which the first sampling section samples the input data signal, and thereby generate a sampling signal, and
a signal generation section configured to generate the first control signal based on the output data signal and the sampling signal.

3. The reception unit according to claim 2, further comprising
a timing adjustment section configured to adjust, in accordance with a second control signal, the sampling timing in the second sampling section, wherein
the signal generation section also generates the second control signal.

4. The reception unit according to claim 3, wherein
the timing adjustment section includes a delay section configured to delay the input data signal by a delay amount in accordance with the second control signal, and
the second sampling section samples the input data signal delayed by the delay section, and thereby generates the sampling signal.

5. The reception unit according to claim 4, wherein the first sampling section samples the input data signal delayed by the delay section, and thereby generates the output data signal.

6. The reception unit according to claim 3, wherein
the timing adjustment section includes a delay section configured to delay the input data signal by a delay amount in accordance with the second control signal, and
the transition detection section detects a transition of the input data signal delayed by the delay section.

7. The reception unit according to claim 3, wherein
the timing adjustment section includes a delay section configured to delay the clock signal by a delay amount in accordance with the second control signal, and
the second sampling section samples the input data signal based on the clock signal delayed by the delay section, and thereby generates the sampling signal.

8. The reception unit according to claim 3, wherein the signal generation section makes a comparison between the output data signal and the sampling signal, and generates the second control signal based on a first comparison result out of results of the comparison, the first comparison result being a result obtained when the output data signal has consecutively made transitions for predetermined number of times or more.

9. The reception unit according to claim 8, wherein the signal generation section generates the first control signal based on a comparison result, out of the results of the comparison, other than the first comparison result.

10. The reception unit according to claim 8, wherein the signal generation section generates the first control signal based on the results of the comparison.

11. The reception unit according to claim 3, wherein the signal generation section makes a comparison between the output data signal and the sampling signal, and generates the first control signal based on a second comparison result out of results of the comparison, the second comparison result being a result obtained when the output data signal makes a first transition after a digit of the output data signal has become identical consecutively for predetermined number of times or more.

12. The reception unit according to claim 11, wherein the signal generation section generates the second control signal based on a comparison result, out of the results of the comparison, other than the second comparison result.

13. The reception unit according to claim 11, wherein the signal generation section generates the second control signal based on the results of the comparison.

14. The reception unit according to claim 8, wherein the transition detection section detects a transition, of the input data signal, made in a first direction and a transition, of the input data signal, made in a second direction.

15. The reception unit according to claim 3, wherein
the transition detection section detects a transition, of the input data signal, made in a first direction, and
the signal generation section makes a comparison between the output data signal and the sampling signal, and generates the first control signal and the second control signal based on a first comparison result and a second comparison result out of results of the comparison, the first comparison result being a result obtained when the output data signal makes a transition in the first direction, and the second comparison result being a result obtained when the output data signal makes a first transition in a second direction after the output data signal has made the transition in the first direction.

16. The reception unit according to claim 15, wherein the transition detection section performs frequency division on the input data signal based on the transition, of the input data signal, in the first direction, and detects a transition of the input data signal subjected to the frequency division.

17. The reception unit according to claim 15, wherein the signal generation section generates the first control signal based on the results of the comparison when the first comparison result is different from the second comparison result.

18. The reception unit according to claim 15, wherein the signal generation section generates the second control signal based on the results of the comparison when the first comparison result is same as the second comparison result.

19. The reception unit according to claim 2, wherein
the first sampling section samples the input data signal at a timing at which the clock signal makes a transition in a first direction, and
the second sampling section samples the input data signal at a timing at which the clock signal makes a transition in a second direction.

20. The reception unit according to claim 2, wherein
the clock signal includes a plurality of clock signals that have phases different from one another, and
the first sampling section and the second sampling section sample the input data signal based on the plurality of clock signals.

21. The reception unit according to claim 1, wherein the control section generates the first control signal based on the clock signal and a reference clock signal in a predetermined period.

22. The reception unit according to claim 1, wherein the control section generates the first control signal based on the clock signal and the input data signal in a predetermined period.

23. The reception unit according to claim 21, wherein the predetermined period is a period after activating a system.

24. A receiving method, comprising:
detecting a transition of an input data signal;
generating a clock signal and varying a phase of the clock signal based on the transition of the input data signal, the clock signal having a frequency in accordance with a first control signal;
sampling the input data signal based on the clock signal, and thereby generating an output data signal; and
generating the first control signal based on the input data signal, the output data signal, and the clock signal.

* * * * *